(12) United States Patent
Suzuki

(10) Patent No.: US 8,466,998 B2
(45) Date of Patent: Jun. 18, 2013

(54) SOLID-STATE IMAGE SENSOR AND IMAGING APPARATUS EQUIPPED WITH SOLID-STATE IMAGE SENSOR

(75) Inventor: Satoshi Suzuki, Tokyo (JP)

(73) Assignee: Nikon Corporation, Tokyo (JP)

( * ) Notice: Subject to any disclaimer, the term of this patent is extended or adjusted under 35 U.S.C. 154(b) by 382 days.

(21) Appl. No.: 12/591,987

(22) Filed: Dec. 7, 2009

(65) Prior Publication Data

US 2010/0091161 A1  Apr. 15, 2010

Related U.S. Application Data

(63) Continuation of application No. PCT/JP2008/060965, filed on Jun. 16, 2008.

(30) Foreign Application Priority Data

Jun. 16, 2007 (JP) ................. 2007-159607

(51) Int. Cl.
| | |
|---|---|
| G03B 13/00 | (2006.01) |
| H04N 5/232 | (2006.01) |
| H04N 9/083 | (2006.01) |
| H04N 3/14 | (2006.01) |
| H04N 5/335 | (2011.01) |
| H04N 9/04 | (2006.01) |

(52) U.S. Cl.
USPC ........... 348/350; 348/349; 348/275; 348/276; 348/277

(58) Field of Classification Search
USPC .................. 348/275–277, 349, 350
See application file for complete search history.

(56) References Cited

U.S. PATENT DOCUMENTS

| | | | |
|---|---|---|---|
| 6,091,793 A | 7/2000 | Kamashita | |
| 6,819,360 B1* | 11/2004 | Ide et al. | 348/340 |
| 6,999,119 B1* | 2/2006 | Shibazaki et al. | 348/273 |

(Continued)

FOREIGN PATENT DOCUMENTS

| | | |
|---|---|---|
| JP | A-11-177076 | 7/1999 |
| JP | A-11-298800 | 10/1999 |

(Continued)

OTHER PUBLICATIONS

JP-2005303409-A—Translation English translation of JP-2005303409-A.*

(Continued)

*Primary Examiner* — Sinh Tran
*Assistant Examiner* — Jason Flohre
(74) *Attorney, Agent, or Firm* — Oliff & Berridge, PLC

(57) ABSTRACT

A solid-state image sensor executing photoelectric conversion for a subject image includes: a plurality of pixels disposed in a two-dimensional pattern and each equipped with a photoelectric conversion unit that generates and stores an electrical charge, wherein: the plurality of pixels are each one of a first pixel and a second pixel; the plurality of pixels are divided into a plurality of pixel blocks; the pixel blocks each include m×n pixels with m pixels and n pixels among the plurality of pixels set respectively along a columnar direction and along a row direction; at least one of the pixels in each pixel block is the first pixel; color filters assuming a single color are disposed at first pixels belonging to a common pixel block; and at least one pixel in at least one pixel block among the plurality of pixel blocks is the second pixel.

18 Claims, 30 Drawing Sheets

U.S. PATENT DOCUMENTS

| | | | |
|---|---|---|---|
| 7,271,835 B2 | 9/2007 | Iizuka et al. | |
| 2003/0011693 A1* | 1/2003 | Oda | 348/272 |
| 2006/0044439 A1* | 3/2006 | Hiyama et al. | 348/308 |
| 2007/0024931 A1* | 2/2007 | Compton et al. | 358/512 |

FOREIGN PATENT DOCUMENTS

| | | |
|---|---|---|
| JP | A-2000-292686 | 10/2000 |
| JP | A-2001-251636 | 9/2001 |
| JP | A-2003-244712 | 8/2003 |
| JP | A-2004-111590 | 4/2004 |
| JP | A-2004-335882 | 11/2004 |
| JP | A-2005-106994 | 4/2005 |
| JP | 2005303409 A * | 10/2005 |
| JP | A-2005-303409 | 10/2005 |

OTHER PUBLICATIONS

International Search Report mailed on Sep. 2, 2008 in the corresponding International Application No. PCT/JP2008/060965.

* cited by examiner

FIG.5A
FIG.5B
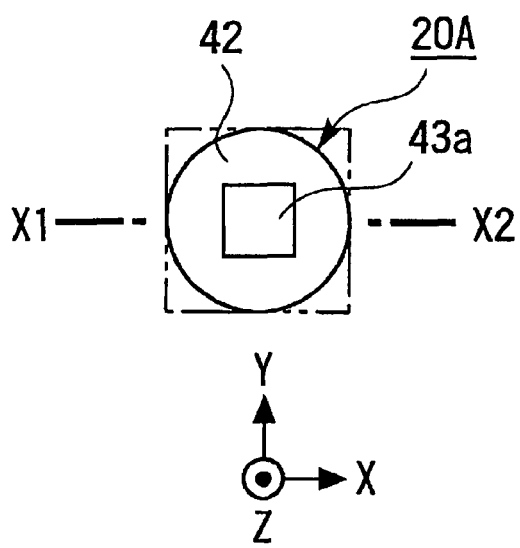
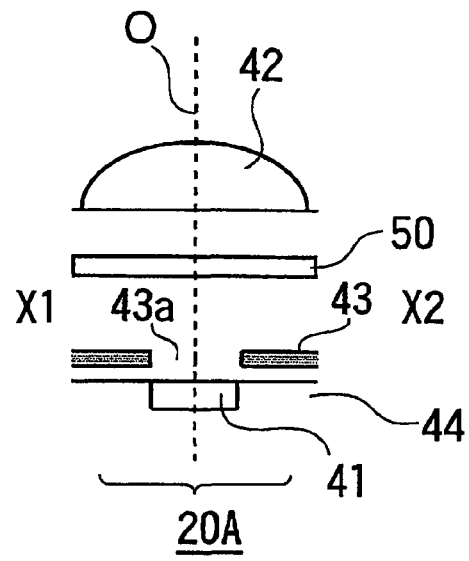

FIG.7A
FIG.7B
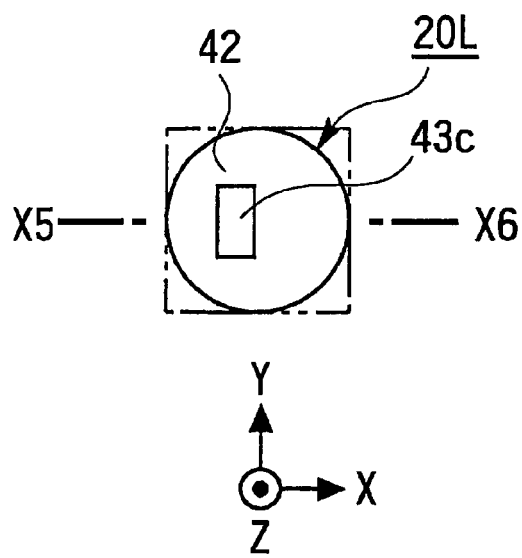
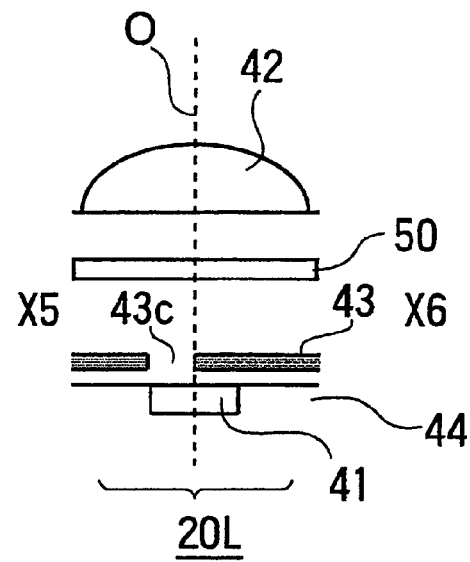

FIG.9A
FIG.9B
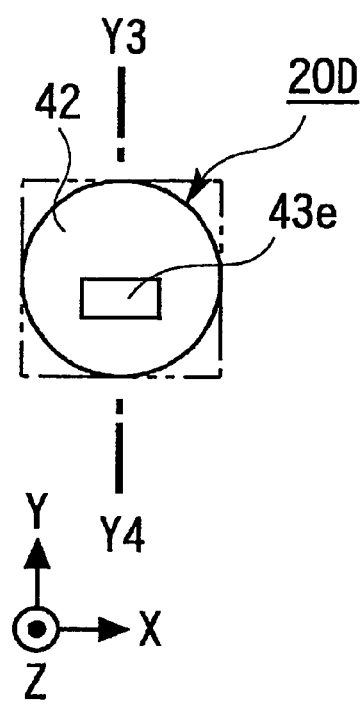
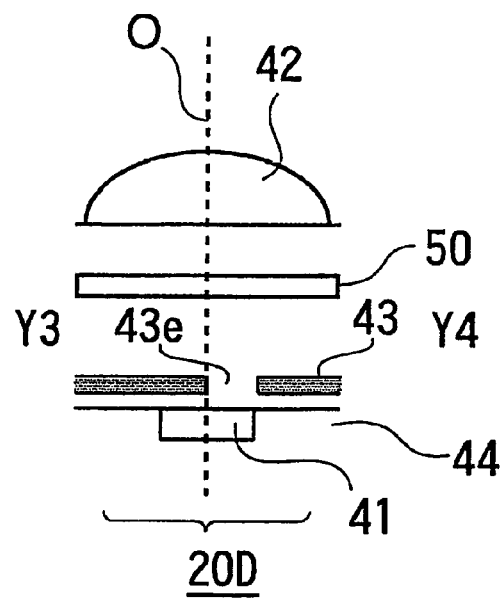

FIG.27A
FIG.27B
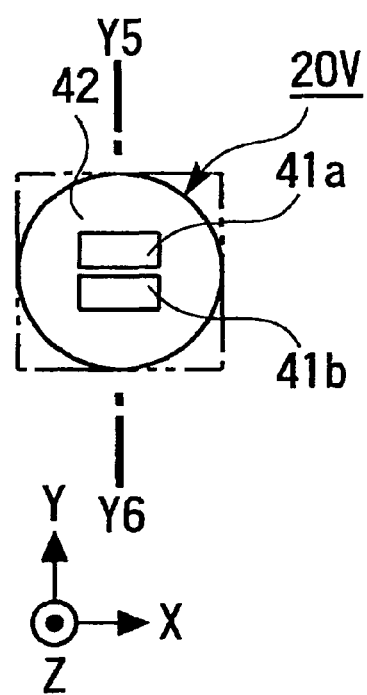
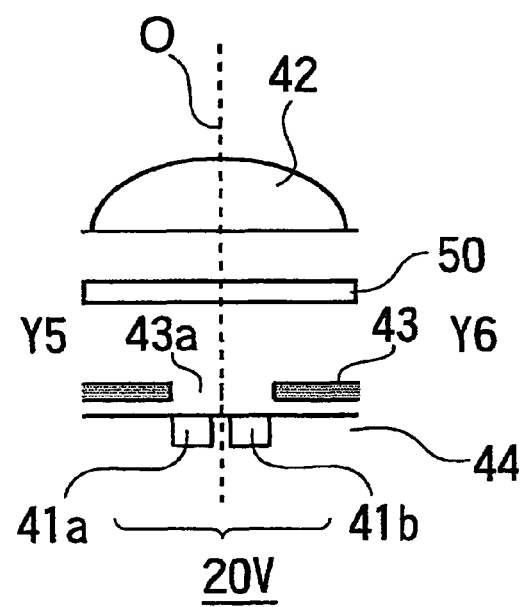

SOLID-STATE IMAGE SENSOR AND IMAGING APPARATUS EQUIPPED WITH SOLID-STATE IMAGE SENSOR

This application is a continuation of International Application No. PCT/JP2008/060965 filed Jun. 16, 2008.

INCORPORATION BY REFERENCE

The disclosure of the following applications are herein incorporated by reference: Japanese Patent Application No. JP2007-159607 filed Jun. 16, 2007; International Application No. PCT/JP2008/060965 filed Jun. 16, 2008.

BACKGROUND OF INVENTION

1. Field of the Invention

The present invention relates to a solid-state image sensor and an imaging apparatus equipped with the solid-state image sensor.

2. Description of Related Art

Today, imaging apparatuses such as video cameras and electronic still cameras are widely used by consumers. Such a camera typically includes a solid-state image sensor which may be, for instance, a CCD sensor or an amplifier-type sensor. The solid-state image sensor is constituted with a plurality of pixels, each equipped with a photoelectric conversion unit that generates a signal charge in correspondence to the amount of incoming light, arrayed in a matrix pattern.

In an amplifier-type solid-state image sensor, the signal charge having been generated and stored at the photoelectric conversion unit at each pixel is guided to an amplifier unit at the pixel and the signal amplified at the amplifier unit is then output from the pixel to a vertical signal line. Japanese Laid Open Patent Publication No. H11-177076 and Japanese Laid Open Patent Publication No. 2004-335882 disclose that the amplifier unit in the amplifier-type solid-state image sensor may be constituted with a junction field effect transistor, or Japanese Laid Open Patent Publication No. 2004-111590 discloses that the amplifier type solid-state image sensor may be a CMOS solid-state image sensor equipped with MOS transistors constituting the amplifier units thereof. In the solid-state image sensor equipped with amplifier units each constituted with a JFET, the gate area of the JFET is used as a charge/voltage conversion unit that takes in the charge generated in the photoelectric conversion unit and converts the charge to a voltage. A floating diffusion functions as the charge/voltage conversion unit in a solid-state image sensor equipped with amplifier units constituted with MOS transistors.

In an imaging apparatus such as a camera, the focusing condition at the photographic lens must be detected in order to enable autofocus adjustment. The focusing condition is detected by a special focus detection element disposed in addition to the solid-state image sensor in the related art. However, an imaging apparatus adopting this structure, which includes the focus detection element and a focus detection optical system used to guide light to the focus detection element, will be a bulky and costly apparatus.

Accordingly, Japanese Laid Open Patent Publication No. 2003-244712 and Japanese Laid Open Patent Publication No. 2000-292686 disclose that solid-state image sensors assuming a structure that allows it to also function as a focus detection element adopting a split-pupil phase-difference focus detection method (may otherwise be referred to as a split-pupil method or a phase-difference method). Through the split-pupil phase-difference method, the extent of defocusing at the photographic lens is detected by splitting a light flux passing through the photographic lens, thereby forming a pair of split images and detecting the amount to which the patterns in the split images are offsets relative to each other (the amount of phase shift).

The solid-state image sensors disclosed in Japanese Laid Open Patent Publication No. 2003-244712 and Japanese Laid Open Patent Publication No. 2000-292686 each include a plurality of focus detection pixels via which focus detection signals to be used to detect the focusing condition are generated, disposed therein in addition to imaging pixels that output imaging signals used to form image signals expressing a subject image. Each imaging pixel, equipped with a single photoelectric conversion unit, includes a color filter disposed thereat and outputs a signal resulting from photoelectric conversion executed on a light flux received from an area of the exit pupil of the photographic lens, not substantially offset from the center of the exit pupil. The focus detection pixels at the solid-state image sensor disclosed in patent reference 4 or 5, each equipped with two separate photoelectric conversion units, do not include color filters disposed thereat. No color filters are disposed at the focus detection pixels in order to increase the SN ratio in the focus detection signals by maximizing the quantity of light entering therein without imposing any restrictions with regard to the incoming wavelength and thus improve the focus detection accuracy. Over the photoelectric conversion units, micro lenses are disposed each in correspondence to one of the pixels. The two separate photoelectric conversion units at each focus detection pixel are disposed at a position at which images of the photoelectric conversion units are substantially formed on the exit pupil of the photographic lens via the microlens at a position substantially conjugate with the position of the exit pupil of the photographic lens. This means that since the distance between the exit pupil of the photographic lens and the micro lens is sufficiently long in relation to the size of the micro lens, the two separate photoelectric conversion units are disposed at a position substantially matching the focusing plane of the micro lens. At each focus detection pixel assuming the positional relationship described above, one of the two photoelectric conversion units selectively receives a light flux transmitted through an area ranging over part of the exit pupil of the photographic lens and offset along a specific direction from the center of the exit pupil, and thus performs photoelectric conversion. The other photoelectric conversion unit at the focus detection pixel selectively receives a light flux transmitted through an area ranging over part of the exit pupil of the photographic lens and offset along the opposite direction from the center of the exit pupil and performs photoelectric conversion.

The signals output from the focus detection pixels in the solid-state image sensor disclosed in Japanese Laid Open Patent Publication No. 2003-244712 and Japanese Laid Open Patent Publication No. 2000-292686, with no color filters disposed thereat, cannot be used as imaging signals based upon which image signals expressing the subject image are formed. Thus, a condition akin to that caused by the absence of a pixel is induced at the individual focus detection pixels during imaging operation. Accordingly, simulated image signals are generated through processing referred to as interpolation executed for areas where the focus detection pixels are disposed. Japanese Laid Open Patent Publication No. 2001-251636 discloses that the interpolation processing is normally executed in order to generate a simulated image signal in correspondence to a defective pixel by determining the defective pixel from which no signal is not output or where a significant level of noise is present and by using signals output from normal pixels in the surrounding area. For instance, if a normal signal is output from a given signal that should generate a blue (B) signal, the signals from four normal B pixels present in the surrounding area are averaged and the averaged signal value is used as the signal value of the simulated image signal corresponding to the defective pixel.

It is to be noted that focus detection pixels are often disposed over specific local areas, e.g., over a top area and a bottom area, a left-side area, a right-side area or a central area, as disclosed in Japanese Laid Open Patent Publication No. 2000-292686, rather than evenly over the entire effective pixel area at the solid-state at the solid-state image sensor as disclosed in Japanese Laid Open Patent Publication No. 2003-244712. This is because if the focus detection pixels are evenly distributed over the entire effective pixel area, the number of imaging pixels is bound to decrease to result in a lower image quality and the load of the interpolation processing described earlier increases.

SUMMARY OF THE INVENTION

In the solid-state image sensor disclosed in patent reference 4 (see FIG. 2 in patent reference 4), the imaging pixels are disposed in a Bayer array with focus detection pixels, replacing half of the G pixels (imaging pixels that generate green (G) signals), disposed evenly over the entire effective pixel area. This means that since imaging pixels that output signals in a color matching that of the image signal to be generated in correspondence to the position assumed by a given focus detection pixel through the interpolation processing described earlier, are not present in close proximity to the focus detection pixel, the interpolation processing must be executed by using the output signals generated at imaging pixels located away from the focus detection pixel, which is bound to result in lower interpolation accuracy and lower image quality.

In the solid-state image sensor disclosed in patent reference 5 (see FIGS. 4 and 9 in patent reference 5), the imaging pixels are disposed in a Bayer array, and focus detection pixels, replacing a plurality of imaging pixels disposed side-by-side in a straight line in a given row or column within a specific area (focus detection area), are disposed along a straight line within the focus detection area. Since imaging pixels that output signals in a color matching that of the image signal to be generated in correspondence to the position assumed by each focus detection pixel through the interpolation processing described earlier are not present in close proximity to the focus detection pixel, the interpolation processing must be executed by using the output signals generated at imaging pixels located away from the focus detection pixel, which is bound to result in lower interpolation accuracy and lower image quality.

A solid-state image sensor according to the 1st aspect of the present invention, which executes photoelectric conversion for a subject image formed through an optical system, comprises: a plurality of pixels disposed in a two-dimensional pattern and each equipped with a photoelectric conversion unit that generates and stores an electrical charge corresponding to incident light, wherein: the plurality of pixels are each one of a first pixel and a second pixel, the first pixel outputting a signal obtained through photoelectric conversion executed on a light flux received from an area of an exit pupil of the optical system, which is substantially not offset from a center of the exit pupil, and the second pixel outputting a signal obtained through photoelectric conversion executed on a light flux selectively received from an area of the exit pupil of the optical system, which is substantially offset from the center of the exit pupil; the plurality of pixels are divided into a plurality of pixel blocks set in a two-dimensional pattern; the pixel blocks each include m×n pixels disposed in a two-dimensional pattern with m pixels and n pixels among the plurality of pixels set respectively along a columnar direction and along a row direction, assuming that m and n each represent an integer equal or greater that 2; at least one of the pixels in each pixel block is the first pixel; color filters assuming a single color are disposed at first pixels belonging to a common pixel block; and at least one pixel among the m×n pixels in at least one pixel block among the plurality of pixel blocks is the second pixel.

According to the 2nd aspect of the present invention, it is preferred that in the solid-state image sensor according to the 1st aspect, two or more pixels among the m×n pixels in each pixel block among all of or most of the plurality of pixel blocks are first pixels.

According to the 3rd aspect of the present invention, it is preferred that in the solid-state image sensor according to the 1st or 2nd aspect m and n each represent 2.

According to the 4th aspect of the present invention, it is preferred that in the solid-state image sensor according any one of the 1st through 3rd aspects, a specific number of second pixels among the plurality of pixels are arrayed along a straight line occupying adjacent positions in sequence in a single row or a single column over two or more pixel blocks among the plurality of pixel blocks in a specific area.

According to the 5th aspect of the present invention, in the solid-state image sensor according any one of the 1st through the 3rd aspects, a specific number of second pixels among the plurality of pixels may be arrayed in a zigzag pattern occupying adjacent positions in sequence in two adjacent rows or two adjacent columns over two or more pixel blocks among the plurality of pixel blocks in a specific area.

According to the 6th aspect of the present invention, it is preferred that in the solid-state image sensor according any one of the 1st through the 5th aspects, the plurality of pixel blocks are set in a Bayer array based upon colors assumed for the pixel blocks by regarding the color of the color filters disposed at the first pixel in each pixel block as representing the color of the pixel block.

According to the 7th aspect of the present invention, in the solid-state image sensor according any one of the 1st through the 6th aspects, at least one pixel block among the plurality of pixel blocks may include two second pixels, one of which includes a single photoelectric conversion unit and outputs a signal obtained through photoelectric conversion executed on a light flux selectively received from an area of the exit pupil of the optical system, substantially offset along a specific direction from the center of the exit pupil and another one of which includes a single photoelectric conversion unit and outputs a signal obtained through photoelectric conversion executed on a light flux selectively received from an area of the exit pupil of the optical system, substantially offset from the center of the exit pupil of the optical system along a direction opposite from the specific direction.

According to the 8th aspect of the present invention, in the solid-state image sensor according any one of the 1st through the 6th aspects, at least one pixel block among the plurality of pixel blocks can include the second pixel constituted with a pixel equipped with a first photoelectric conversion unit that selectively receives a light flux from an area of the exit pupil of the optical system, substantially offset from the center of the exit pupil along a specific direction and a second photoelectric conversion unit that selectively receives a light flux from an area of the exit pupil of the optical system, substantially offset from the center of the exit pupil along a direction opposite from the specific direction, which individually outputs signals obtained through photoelectric conversion individually executed at the first photoelectric conversion unit and the second photoelectric conversion unit.

According to the 9th aspect of the present invention, in the solid-state image sensor according any one of the 1st through the 8th aspects, n pixels present in a single column in each pixel block can share a common amplifier unit that outputs a signal corresponding to a potential assumed at a charge/voltage conversion unit that receives the electrical charge generated at the photoelectric conversion unit and converts the electrical charge to a voltage.

According to the 10th aspect of the present invention, it is preferred that in the solid-state image sensor according any one of the 1st through the 9th aspects, the pixel block that includes the second pixel is distributed over an entirety of or most of an effective pixel area.

According to the 11th aspect of the present invention, it is preferred that in the solid-state image sensor according any one of the 1st through the 9th aspects, the pixel block that includes the second pixel is distributed locally over part of an effective pixel area.

According to the 12th aspect of the present invention, it is preferred that in the solid-state image sensor according any one of the 1st through the 11th aspects, a color filter assuming a color matching the color of the color filter disposed at the first pixel in the pixel block, to which the second pixel belongs, is disposed at the second pixel.

According to the 13th aspect of the present invention, it is preferred that in the solid-state image sensor according any one of the 1st through the 11th aspects, no color filter is disposed at the second pixel.

An imaging apparatus according to the 14th aspect of the present invention comprises: a solid-state image sensor according any one of the 1st through 13th aspects; a detection processing unit that outputs a detection signal indicating a focusing condition at the optical system based upon signals generated from at least some second pixels; and an adjustment unit that execute focus adjustment for the optical system based upon the detection signal provided from the detection processing unit.

BRIEF DESCRIPTION OF THE DRAWINGS

FIGS. 5A and 5B show schematic illustrations of the essential structure of the imaging pixels in FIG. 4, with FIG. 5A showing a schematic plan view of the essential part of an imaging pixel and FIG. 5B showing a schematic sectional view taken along line X1-X2 in FIG. 5A;

FIGS. 7A and 7B shows schematic illustrations of the essential structure of another specific type of AF pixel in FIG. 4, with FIG. 7A showing a schematic plan view of the essential part of an AF pixel and FIG. 7B showing a schematic sectional view taken along line X5-X6 in FIG. 7A;

FIGS. 9A and 9B shows schematic illustrations of the essential structure of yet another specific type of AF pixel in FIG. 4, with FIG. 9A showing a schematic plan view of the essential part of an AF pixel and FIG. 9B showing a schematic sectional view taken along line Y3-Y4 in FIG. 9A;

FIGS. 27A and 27B show schematic illustrations of the essential structure of another specific type of AF pixel in FIG. 25, with FIG. 27A showing a schematic plan view showing the essential structure of a pixel and FIG. 27B showing a schematic sectional view taken along line Y5-Y6 in FIG. 27A;

DESCRIPTION OF PREFERRED EMBODIMENT

The following is a description of the embodiments of the solid-state image sensor according to the present invention and an imaging apparatus equipped with the solid-state image sensor, given in reference to the drawings.

First Embodiment

Figure 1:
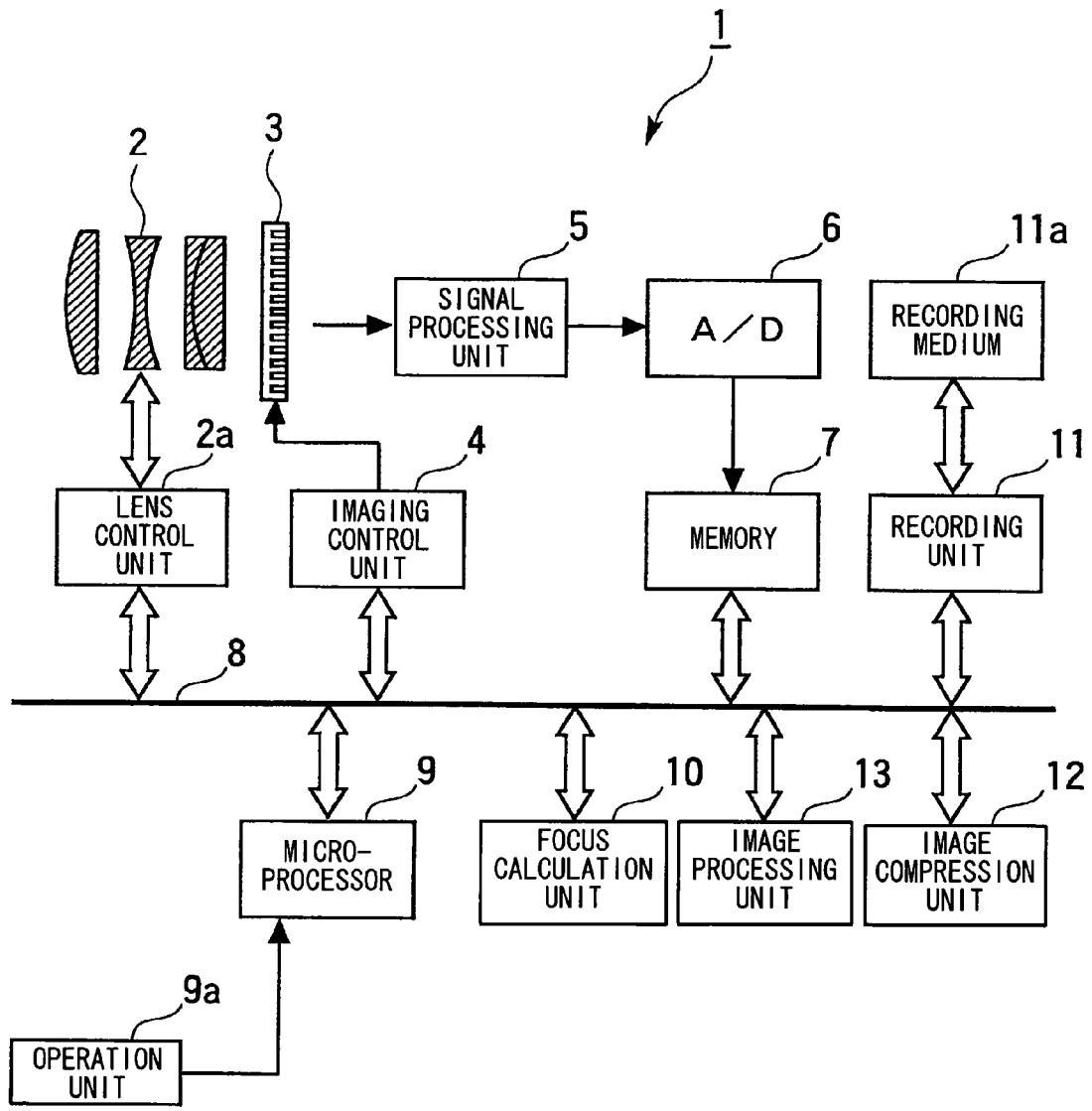
FIG. 1 shows a schematic block diagram of the electronic camera achieved as a first embodiment of the imaging apparatus according to the present invention.

FIG. 1 is a schematic block diagram of an electronic camera 1 achieved in the first embodiment of the imaging apparatus according to the present invention. A photographic lens 2, used as an optical system through which a subject image is formed, is mounted at the electronic camera 1. As a lens control unit 2a drives the photographic lens 2, the focus and the aperture are adjusted. An imaging surface of a solid-state image sensor 3, which executes photoelectric conversion for the subject image formed via the photographic lens 2, is set within the image space of the photographic lens 2.

The solid-state image sensor 3 outputs signals as it is driven in response to a command issued by an imaging control unit 4. The solid-state image sensor 3 outputs imaging signals used to form image signals expressing a subject image and focus detection signals used to detect the focusing condition of the photographic lens 2. The imaging signals or the focus detection signals first undergo processing at a signal processing unit 5 and an A/D conversion unit 6 and are then temporarily stored into a memory 7. The memory 7 is connected to a bus 8. The lens control unit 2a, the imaging control unit 4, a microprocessor 9, a focus calculation unit (detection processing unit) 10, a recording unit 11, an image compression unit 12, an image processing unit 13 and the like, too, are connected to the bus 8. An operation unit 9a, which includes, for instance, a shutter release button is connected to the microprocessor 9. In addition, a recording medium 11a is detachably loaded into the recording unit 11.

Figure 2:
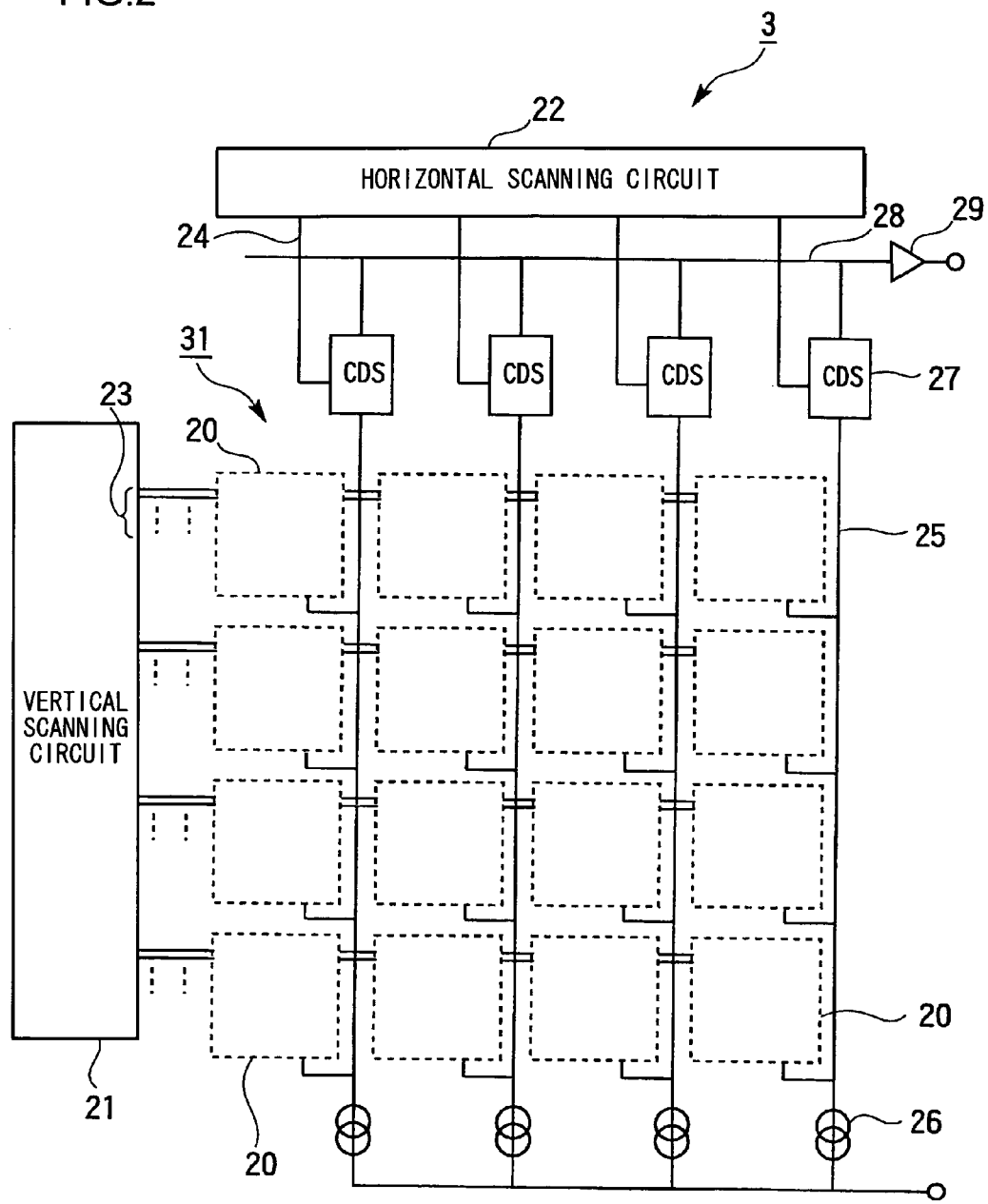
FIG. 2 shows a schematic circuit diagram showing the structure adopted in the solid-state image sensor in FIG. 1.

FIG. 2 is a circuit diagram schematically illustrating the structure of the solid-state image sensor 3 in FIG. 1. The solid-state image sensor 3 includes a plurality of pixels 20 disposed in a two-dimensional matrix pattern and peripheral circuits to which signals from the pixels 20 are output. Reference numeral 31 indicates the effective pixel area (imaging area) where the pixels 20 are disposed in the matrix pattern. FIG. 2 shows 4 (across)×4 (down)=16 pixels 20 in order to simplify the illustration. It will be obvious, however, that the solid-state image sensor in the embodiment actually includes a great many more than 16 pixels. The present invention may be adopted in conjunction with any number of pixels.

The solid-state image sensor 3 in the embodiment includes imaging pixels 20A as pixels to be described in detail and focus detection pixels (hereafter may be referred to as "AF pixels") 20R, 20L, 20U and 20D that generate focus detection signals. However, the pixels shown in FIG. 2 are all assigned with reference numeral 20, without distinguishing one type of pixel from another to simplify the illustration. The specific circuit structures and structural features of the various types of pixels are to be described in detail later. A pixel 20 outputs an imaging signal or a focus detection signal in response to a drive signal departing a peripheral circuit. The pixels may be driven so that the photoelectric conversion units at all the pixels 20 are simultaneously reset and the pixels 20 are all exposed over equal lengths of time with matching timing, or the pixels may be driven through a rolling shutter operation, whereby signals are read out from one row at a time.

The peripheral circuits include a vertical scanning circuit 21, a horizontal scanning circuit 22, drive signal lines 23 and 24 connected to the scanning circuits, vertical signal lines 25 via which signals from the pixels 20 are transferred, constant current sources 26, and correlated double sampling circuits (CDS circuits) 27 connected to the vertical signal lines 25, a horizontal signal line 28 that receives signals output from the CDS circuits 27, an output amplifier 29 and the like.

The vertical scanning circuit 21 and the horizontal scanning circuit 22 each output a drive signal based upon a command issued by the imaging control unit 4 in the electronic camera 1. The pixels 20 are each driven as the drive signal output from the vertical scanning circuit 21 is taken in via a specific drive signal line 23 and each output an imaging signal or a focus detection signal to the corresponding vertical signal line 25. A plurality of drive signals are output from the vertical scanning circuit 21 and a plurality of drive signal lines 23 are installed in correspondence.

The signals output from the pixels 20 undergo a specific noise removal process at the CDS circuits 27. The signals are then output via the horizontal signal line 28 and the output amplifier 29 to an external recipient, prompted by the drive signal output from the horizontal scanning circuit 22.

Figure 3:
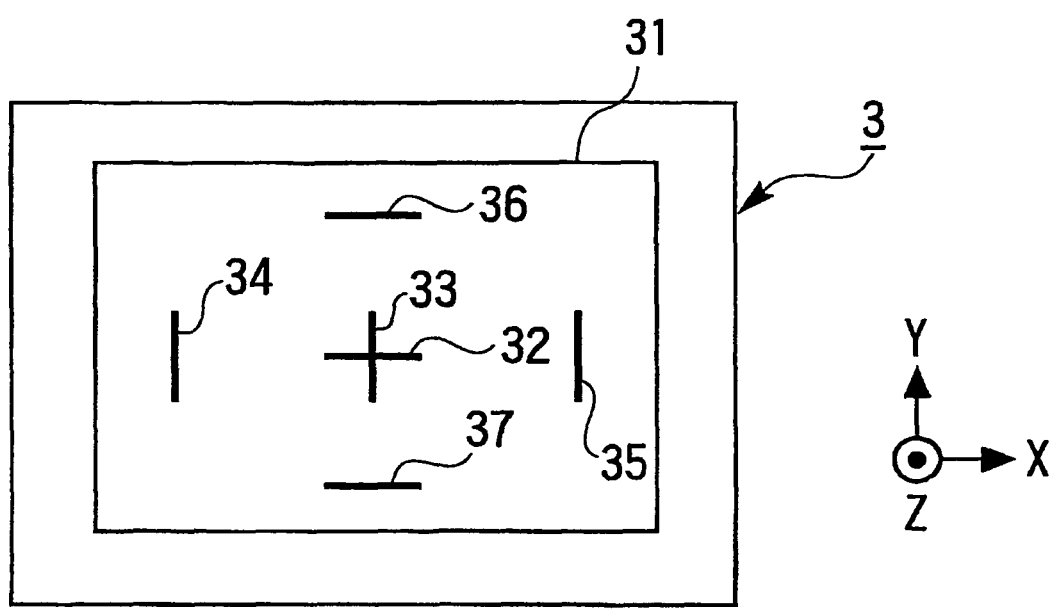
FIG. 3 shows a schematic plan view of the solid-state image sensor in FIG. 1.

FIG. 3 is a schematic plan view of the solid-state image sensor 3 (more specifically an effective pixel area 31 thereof) in FIG. 1. A plurality of focus detection areas 32~37 are formed in the effective pixel area 31 at the solid-state image sensor 3 in the embodiment, as shown in FIG. 3. The focus detection areas 32 and 33, intersecting each other, are set so as to form a cross shape at a substantial center of the effective pixel area 31. The focus detection area 34 is set on the left side of the effective pixel area 31, whereas the focus detection area 35 is set on the right side of the effective pixel area. The focus detection area 36 is set over an upper area of the effective pixel area, whereas the focus detection area 37 is set over a lower area of the effective pixel area. It is to be noted that an X axis, a Y axis and a Z axis extending perpendicular to one another are defined as shown in FIG. 3. The direction extending as indicated by the arrow along the X axis is referred to as the "+X direction" or the "+X side", whereas the opposite direction is referred to as the "−X direction" or the "−X side". A similar convention applies with regard to the Y axis as well. The XY plane and the imaging plane (light-receiving surface) of the solid-state image sensor 3 range parallel to each other. The pixels 20 are set side-by-side in rows that extend along the X axis and in columns that extend along the Y axis. It is to be noted that the incoming light enters from above the drawing sheet on which FIG. 3 is drawn and advances downward into the figure. This arrangement also applies to later drawings.

Figure 4:
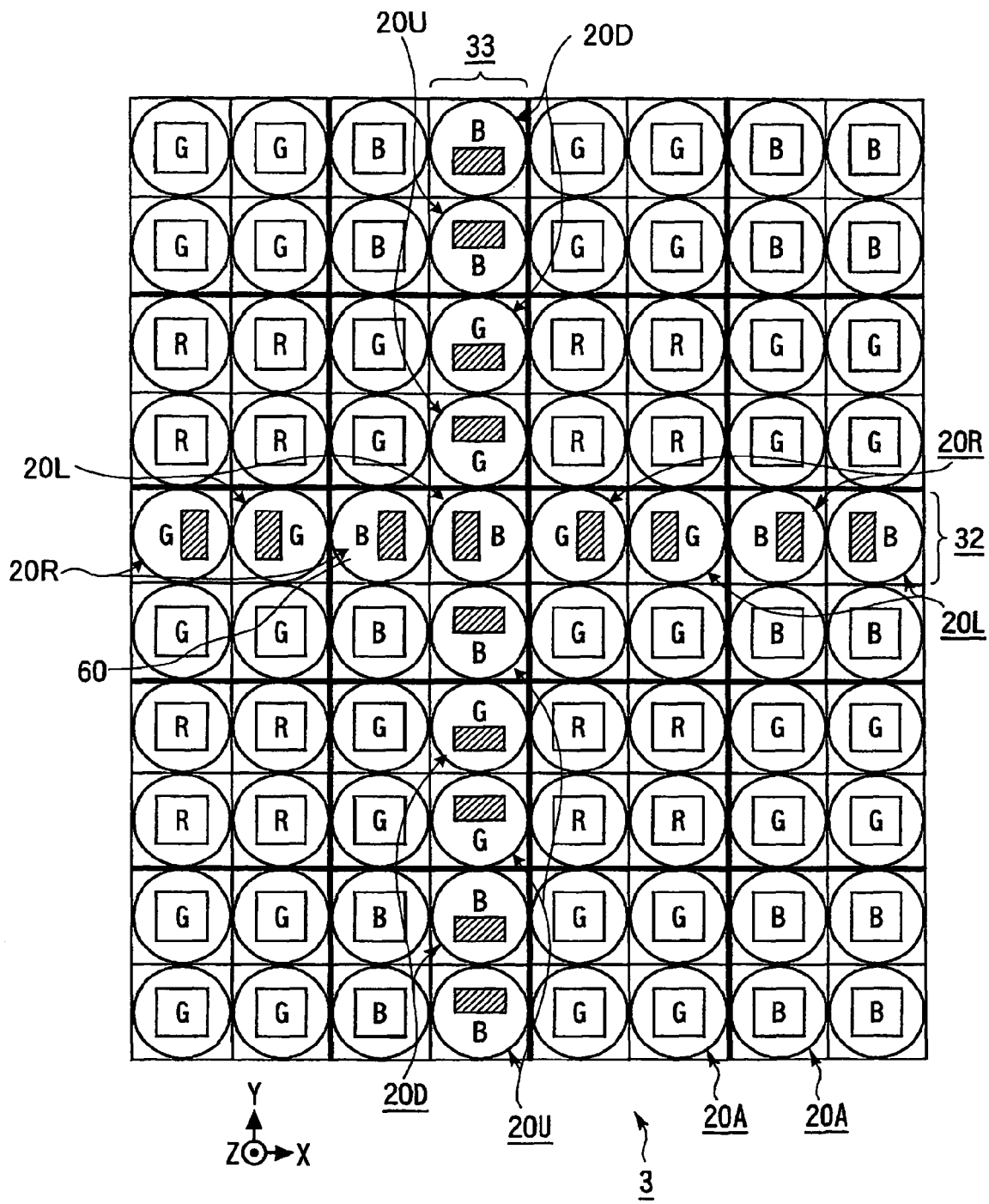
FIG. 4 shows an enlargement schematically illustrating an area where focus detection areas intersect each other in FIG. 3.

FIG. 4 shows, in a schematic enlargement, the pixel arrangement adopted in the area over which the focus detection areas 32 and 33 in FIG. 3 intersect each other. A color filter is disposed at each pixel 20 in the embodiment. In addition, the pixels at the solid-state image sensor 3 are categorized into one type of imaging pixels 20A and four types of AF pixels 20R, 20L, 20U and 20D without distinguishing them by the colors of the color filters disposed at the individual pixels 20. In the following description, the AF pixels may all be indicated with the reference numeral 20F without distinguishing their types.

FIG. 5A is a schematic plan view of the essential part of an imaging pixel 20A, whereas FIG. 5B is a schematic sectional view taken along line X1-X2 in FIG. 5A. The imaging pixel 20A includes a photodiode 41 functioning as a photoelectric conversion unit, a micro-lens 42 disposed through on-chip formation over the photodiode 41 and a color filter 50 in R (red), G (green) or B (blue), which is disposed on the side where light enters the photodiode 41. It is to be noted that the colors of the color filters 50 disposed at the individual imaging pixels 20A (and at the individual AF pixels 20R, 20L, 20U and 20D) are indicated as R, G and B in FIG. 4. In addition, as shown in FIGS. 5A and 5B, a light shielding layer 43, constituted with a metal layer or the like, to function as a light shielding portion, is formed substantially over the focal plane of the micro-lens 42. The light shielding layer 43 may also function as a wiring layer as needed. A square opening 43a, centered on an optical axis O of the micro-lens 42, is formed at the light shielding layer 43 of the imaging pixel 20A. The photodiode 41 at the pixel 20A assumes a size that allows it to effectively receive all the light having passed through the opening 43a. It is to be noted that an inter-layer insulating film and the like are formed between the light shielding layer 43 and the micro-lens 42 and between a substrate 44 and the light shielding layer 43.

The pixel 20A in the embodiment includes the light shielding layer 43 disposed substantially at the focal plane of the micro-lens 42, with the opening 43a formed at the light shielding layer 43. Thus, a light flux transmitted through an area of the exit pupil of the photographic lens 2, which is substantially not offset from the center of the exit pupil, i.e., departing an area corresponding to the image of the opening 43a projected via the micro-lens 42, is received and undergoes photoelectric conversion at the photodiode 41 of the imaging pixel 20A. To be more exact, photoelectric conversion is executed at the photodiode 41 on the light flux received from an area of the exit pupil, which is not decentered relative to the incident light axis centered on the intersecting point at which the optical axis of the photographic lens 2 and the exit pupil plane intersect each other and passing through the center of the pixel.

Figure 6A:
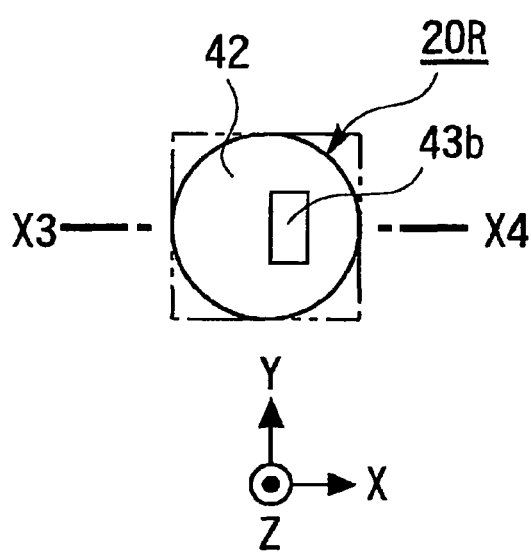
FIGS. 6A and 6B show schematic illustrations of the essential structure of a specific type of AF pixel in FIG. 4, with FIG. 6A showing a schematic plan view of the essential part of an AF pixel and FIG. 6B showing a schematic sectional view taken along line X3-X4 in FIG. 6A.
Figure 6B:
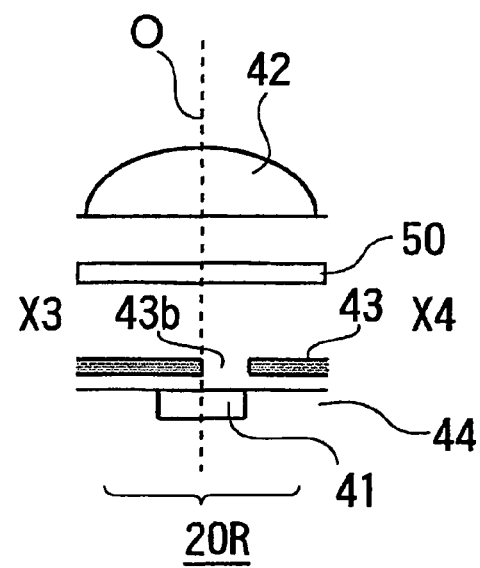

FIG. 6A is a schematic plan view of the essential part of an AF pixel 20R, whereas FIG. 6B is a schematic sectional view taken along line X3-X4 in FIG. 6A. In FIGS. 6A and 6B, the same reference numerals are assigned to elements identical to or corresponding to elements shown in FIGS. 5A and 5B, and the elements assigned with the same reference numerals to those in FIGS. 5A and 5B are not repeatedly explained. This principle also applies in the description of FIGS. 7A through 9B.

The AF pixel 20R differs from the imaging pixel 20A in that a rectangular opening 43b ranging over an area that matches the right half (on the +X side) of a square centering on the optical axis O of the micro-lens 42 at the particular AF pixel 20R (a square with the size equal to that of the opening 43a), is formed at the light shielding layer 43 of the AF pixel 20R. The opening 43b ranges over an area half the size of the square area (opening 43a). The size of the photodiode 41 at the pixel 20R is the same as the size of the photodiode 41 at the imaging pixel 20A. While the opening 43b ranges over an area half the area of the opening 43a in the embodiment, the present invention is not limited to this example. For instance, the opening 43b may range over an area accounting for approximately 40% or 60% of the area of the opening 43a. It is desirable that the opening 43b at the AF pixel 20R range over an area equal to the area of an opening 43c at the AF pixel 20L to be described in detail later. It is also desirable that an opening 43d at the AF pixel 20U range over an area equal to the area of an opening 43e at the AF pixel 20D to be described in detail later.

The opening 43b is formed at the light shielding layer 43 of the pixel 20R. Thus, a light flux transmitted through the area substantially offset along the −X direction relative to the center of the exit pupil among the light flux transmitted through the entire area of the exit pupil of the photographic lens 2 is selectively received and undergoes photoelectric conversion at the photodiode 41. To be more exact, photoelectric conversion is executed at the photodiode 41 on the light flux received from an area of the exit pupil, which is decentered along the −X direction relative to the incident light axis centered on the intersecting point at which the optical axis of the photographic lens 2 and the exit pupil plane intersect each other and passing through the center of the pixel.

FIG. 7A is a schematic plan view of the essential part of an AF pixel 20L, whereas FIG. 7B is a schematic sectional view taken along line X5-X6 in FIG. 7A. The AF pixel 20L differs from the imaging pixel 20A in that the rectangular opening 43c ranging over an area that matches the left half (on the −X side) of a square centering on the optical axis O of the micro-lens 42 at the particular AF pixel 20L (a square with the size equal to that of the opening 43a), is formed at the light shielding layer 43 of the AF pixel 20L. The opening 43c ranges over an area half the size of the opening 43a. Thus, a light flux transmitted through the area substantially offset along the +X direction relative to the center of the exit pupil among the light flux transmitted through the entire area of the exit pupil of the photographic lens 2 is selectively received and undergoes photoelectric conversion at the photodiode 41 of the pixel 20L. To be more exact, photoelectric conversion is executed at the photodiode 41 on the light flux received from an area of the exit pupil, which is decentered along the +X direction relative to the incident light axis centered on the intersecting point at which the optical axis of the photographic lens 2 and the exit pupil plane intersect each other and passing through the center of the pixel.

Figure 8A:
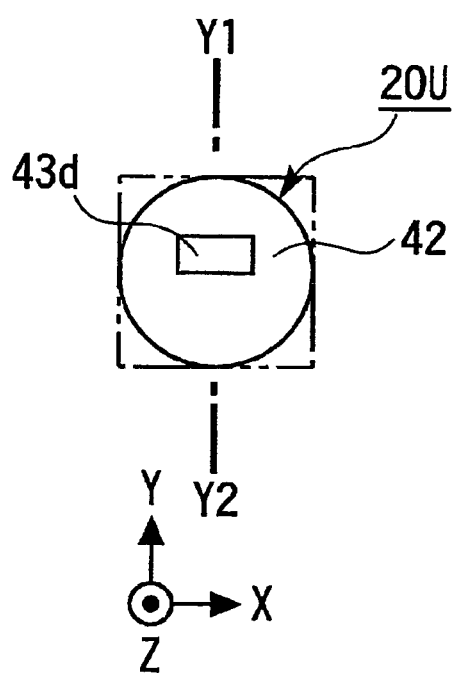
FIGS. 8A and 8B show schematic illustrations of the essential structure of yet another specific type of AF pixel in FIG. 4, with FIG. 8A showing a schematic plan view of the essential part of an AF pixel and FIG. 8B showing a schematic sectional view taken along line Y1-Y2 in FIG. 8A.
Figure 8B:
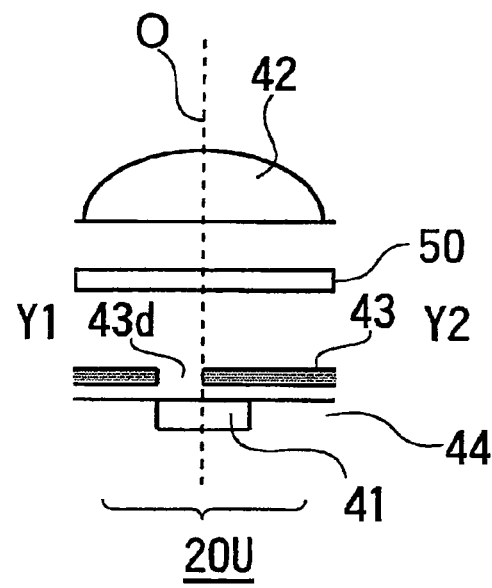

FIG. 8A is a schematic plan view of the essential part of an AF pixel 20U, whereas FIG. 8B is a schematic sectional view taken along line Y1-Y2 in FIG. 8A. The AF pixel 20U differs from the imaging pixel 20A in that the rectangular opening 43d ranging over an area that matches the upper half (on the +Y side) of a square centering on the optical axis O of the micro-lens 42 at the particular AF pixel 20U (a square with the size equal to that of the opening 43da) is formed at the light shielding layer 43 of the AF pixel 20U. The opening 43d ranges over an area half the size of the opening 43a. Thus, a light flux transmitted through the area substantially offset along the −Y direction relative to the center of the exit pupil among the light flux transmitted through the entire area of the exit pupil of the photographic lens 2 is selectively received and undergoes photoelectric conversion at the photodiode 41 of the pixel 20U. To be more exact, photoelectric conversion is executed at the photodiode 41 on the light flux received from an area of the exit pupil, which is decentered along the −Y direction relative to the incident light axis centered on the intersecting point at which the optical axis of the photographic lens 2 and the exit pupil plane intersect each other and passing through the center of the pixel.

FIG. 9A is a schematic plan view of the essential part of an AF pixel 20D, whereas FIG. 9B is a schematic sectional view taken along line Y3-Y4 in FIG. 9A. The AF pixel 20D differs from the imaging pixel 20A in that the rectangular opening 43e ranging over an area that matches the lower half (on the −Y side) of a square centering on the optical axis O of the micro-lens 42 at the particular AF pixel 20D (a square with the size equal to that of the opening 43a is formed at the light shielding layer 43 of the AF pixel 20D. The opening 43e ranges over an area half the size of the opening 43a. Thus, a light flux transmitted through the area substantially offset along the +Y direction relative to the center of the exit pupil among the light flux transmitted through the entire area of the exit pupil of the photographic lens 2 is selectively received and undergoes photoelectric conversion at the photodiode 41 of the pixel 20D. To be more exact, photoelectric conversion is executed at the photodiode 41 on the light flux received from an area of the exit pupil, which is decentered along the +Y direction relative to the incident light axis centered on the intersecting point at which the optical axis of the photographic lens 2 and the exit pupil plane intersect each other and passing through the center of the pixel.

The solid-state image sensor 3 in the embodiment is described again in reference to FIG. 4. The numerous pixels 20 disposed in a two-dimensional pattern over the entire effective pixel area 31 at the solid-state image sensor 3 are divided into a plurality of pixel blocks. The plurality of pixel blocks each include 2×2 pixels 20 made up with two pixels adjacent to each other along the columnar direction (along the Y axis) and two pixels adjacent to each other along the row direction (along the X axis). In FIG. 4, each pixel block is formed with the 2×2 pixels 20 enclosed within a bold-line frame. In other words, a pixel block unit made up with the 2×2 pixels 20 is set in a reiterating two-dimensional pattern over the entire effective pixel area 31. The present invention may be adopted in conjunction with pixel blocks other than the 2×2 pixel blocks, and may be adopted in conjunction with pixel blocks each made up with m×n pixels with m and n each representing an integer equal to or greater than 2. It is to be noted that the plurality of pixel blocks do not need to be set adjacent to one another but may instead be positioned over predetermined intervals.

The color filters 50 disposed at the 2×2 pixels 20 making up a given pixel block all assume the same color in the embodiment. Thus, the color information output from each block represents a specific single color. A signal equivalent to the imaging signals output from the four imaging pixels 20A in a given pixel block is regarded as an imaging signal representing the area ranging over the particular pixel block in the embodiment. Namely, the color of the color filters 50 disposed at the pixels 20 (more specifically the photographing pixels 20A) in the pixel block can be regarded as the color representing the pixel block. Pixel blocks are set over the entire effective pixel area 31 in a Bayer array based upon the colors representing the individual blocks in the embodiment. However, the pixel blocks may be set in an array other than a Bayer array. In addition, while the colorimetric system achieved with the specific combination of color filters in the embodiment is the RGB colorimetric system, the present invention may be adopted in conjunction with a complementary colorimetric system (e.g., the magenta-green-cyan-yellow colorimetric system).

The focus detection areas 32, 36 and 37 ranging along the X axis in FIG. 3 are each made up with pixels in a single pixel row, whereas the focus detection areas 33~35 ranging along the Y axis in FIG. 3 are each made up with pixels in a single pixel column. FIG. 4 clearly indicates that the focus detection area 32 is made up with pixels disposed in a single pixel row and that the focus detection area 33 is made up with pixels disposed in a single pixel column.

In FIG. 4, the specific pixel block that includes the pixel 20 (pixel 20L) occupying the position at which the focus detection areas 32 and 33 intersect each other is assigned with reference numeral 60, and the following description is given by distinguishing the pixel block 60 from other pixel blocks. Apart from the pixel block 60, the pixel blocks that contain part of any of the focus detection areas 32, 36 and 37 ranging along the X axis each include two AF pixels 20F (an AF pixel 20R and an AF pixel 20L) and two imaging pixels 20A in the embodiment. The AF pixels 20R and 20L disposed in the matching focus detection area, receive light fluxes having been transmitted through a pair of areas in the exit pupil. Namely, the AF pixel 20R and the AF pixel 20L correspond to a pair of areas resulting from the pupil split. Apart from the pixel block 60, the pixel blocks that contain part of any of the focus detection areas 33~35 ranging along the Y axis each include two AF pixels 20F (an AF pixel 20U and an AF pixel 20D) and two imaging pixels 20A. The AF pixels 20U and 20D disposed in the matching focus detection area receive light fluxes having been transmitted through a pair of areas in the exit pupil. Namely, the AF pixel 20U and the AF pixel 20D correspond to a pair of areas resulting from the pupil split.

The pixel block 60 includes three AF pixels 20F (an AF pixel 20R, an AF pixel 20L and an AF pixel 20U) disposed in the corresponding focus detection areas and a single imaging pixel 20A. Since the AF pixel 20D paired up with the AF pixel 20U is not included in the pixel block 60, the focus detection signal output from the AF pixel 20U in the pixel block 60 cannot be utilized in the actual focus detection. For this reason, the AF pixel 20U in the pixel block 60 may be replaced with an imaging pixel 20A. The pixel blocks that do not contain any part of the focus detection areas 32~37 are each made up with four imaging pixels 20A.

In each of the focus detection areas 32, 36 and 37, AF pixels 20R and 20L are disposed along a straight line, occupying alternate positions in sequence within the same row, so as to make up part of a plurality of pixel blocks set side-by-side along the X axis. In each of the focus detection areas 33~35, AF pixels 20U and 20D are disposed along a straight line, occupying alternate positions in sequence within the same column, so as to make up part of a plurality of pixel blocks set side-by-side along the Y axis. Since the AF pixels 20F are disposed along a straight line occupying alternate positions in sequence within the same row or column, as described above, better focus detection accuracy is assured.

The focusing condition at the photographic lens 2 is detected based upon the focus detection signals output from the AF pixels 20F. During an imaging operation, the outputs from the two imaging pixels 20A are used as the imaging signals in correspondence to each pixel block made up with two AF pixels 20F and two imaging pixels 20A. Namely, the imaging signals individually output from the two imaging pixels 20A are added together within the solid-state image sensor 3 or outside the solid-state image sensor 3. However, no imaging signals are output at the two AF pixels 20F. Accordingly, the signals output from the four pixels disposed in the pixel block that includes two AF pixels 20F are assumed in approximation indicate a substantially uniform light quantity. Then, the imaging signal having been generated as the sum of the signals originating from the two imaging pixels 20A is doubled and the doubled imaging signal is designated as an imaging signal representing the entire pixel block. It is to be noted that a signal obtained by quadrupling the imaging signal from the single imaging pixel 20A may be used as the imaging signal representing the pixel block 60.

In other words, when generating through interpolation a signal corresponding to the position occupied by an AF pixel 20F during an imaging operation, the signal output from an imaging pixel 20A adjacent to the AF pixel 20F can be used in the interpolation processing at the solid-state image sensor 3. As a result, in comparison to the interpolation accuracy of a solid-state image sensor in the related art with individual pixels disposed in the Bayer array or disposed in correspondence to the Bayer array, better interpolation accuracy is assured with regard to the interpolation executed for the AF pixels 20F to achieve better image quality.

Figure 13:
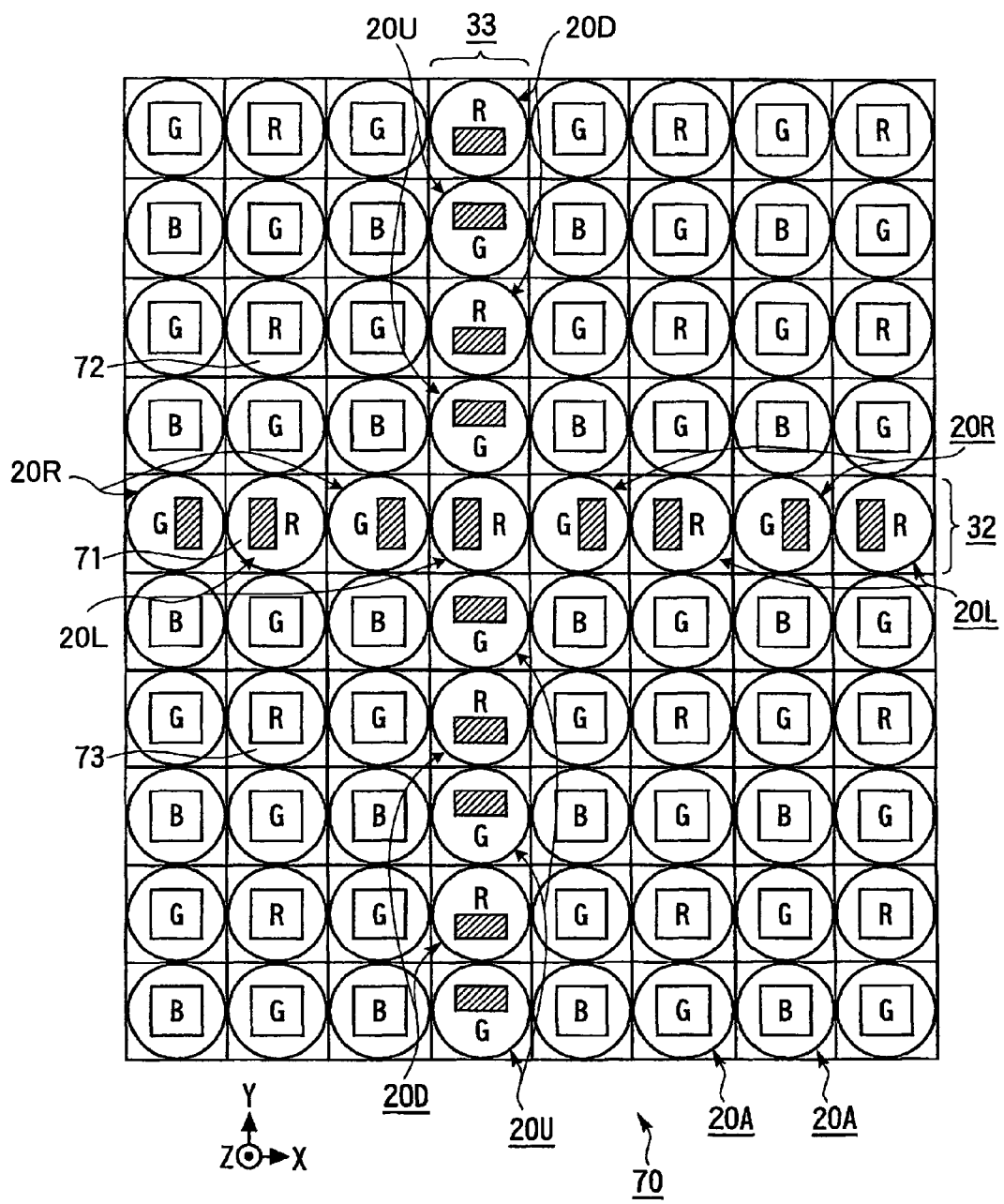
FIG. 13 shows a schematic plan view showing, for purposes of comparison, the pixel arrangement adopted in a solid-state image sensor in a partial enlargement.

This point is further explained in reference to FIG. 13 illustrating a structure of the related art for comparison. FIG. 13 is a schematic plan view similar to that in FIG. 4 showing in a partial enlargement the pixel arrangement adopted in a solid-state image sensor 70 provided for comparison with the solid-state image sensor 3. In FIG. 13, the same reference numerals are assigned to elements identical to or corresponding to those in FIG. 4 to preclude the necessity for a repeated explanation thereof. The structure in this example differs from that of the solid-state image sensor 3 in that the colors of color filters 50 (not shown in FIG. 13) disposed at imaging pixels 20A are set so as to achieve a Bayer array with the individual pixels and that no color filters are disposed at AF pixels 20F (AF pixels 20R, 20L, 20U and 20D).

The letters R, G and B each assigned to an AF pixel 20F in FIG. 13 indicate the color that would be assumed at the imaging pixel that would otherwise occupy the pixel position, rather than the color of a color filter 50. In reference to the comparison example, interpolation executed to generate an R signal in correspondence to the AF pixel 20L assigned with reference numeral 71 is described. The average of the imaging signals output from the two imaging pixels 20A assigned with reference numerals 72 and 73 is calculated and a signal assuming the average value thus calculated is generated through interpolation as the imaging signal for the AF pixel 20F. In the comparison example, the interpolation must be executed by using the signals output from the pixel 72 and 73 occupying positions far from the pixel 71. This means that if, for instance, a subject image expressing a line extending along the X axis astride three rows is formed over the focus detection area 32, the subject image will not be captured at the pixels 72 and 73. Namely, the subject line will not be detected through the interpolation described above, and thus, the accuracy of the interpolation is bound to be poor in this case. In contrast, the signal at an imaging pixel 20A adjacent to the AF pixel 20F can be used in the interpolation processing executed at the solid-state image sensor 3 in the embodiment. For instance, as a subject image expressing a line extending along the X direction astride three rows is formed precisely over the focus detection area 32, the subject image is captured at the adjacent imaging pixels 20A assuming the corresponding colors. In other words, since the subject line can be detected, better interpolation accuracy is assured at the solid-state image sensor 3 in the embodiment.

As described earlier, color filters 50 are disposed both at the AF pixels 20F and at the imaging pixels 20A in the embodiment. However, the present invention may be adopted in a structure with no color filters 50 disposed at the AF pixels 20F. An AF pixel 20F with no color filter 50 disposed thereat will have no restrictions imposed with regard to the incoming wavelength and accordingly, a greater quantity of light enters the photodiode 41 at the AF pixel 20F. As a result, the SN ratio of the focus detection signal generated thereat is improved, which, in turn, improves the focus detection accuracy. This principle applies in the various embodiments to be detailed later.

At an image sensor that includes color filters 50 disposed at the AF pixels 20F, as in the embodiment, the AF pixels 20F may also be utilized as imaging signal generating pixels instead of using them strictly as pixels that generate focus detection signals only, as at the image sensor described above. The effective area of the photoelectric conversion units at the AF pixels 20F (determined in correspondence to the area of the openings 43b through 43e formed at the light shielding layers 43 in the embodiment) is half the effective area of the photoelectric conversion units at the imaging pixels 20A (determined in correspondence to the area of the openings 43a at the light shielding layers 43 in the embodiment). Accordingly, the signals individually output from the two AF pixels 20F and the two imaging pixels 20A may be added together to generate an imaging signal corresponding to three pixels in each pixel block made up with two AF pixels 20F and two imaging pixels 20A. The imaging signal representing the three pixels may then be multiplied by 4/3 to generate an imaging signal representing the four pixels. It is to be noted that the signals individually output from the single imaging pixel 20A and the three AF pixels 20F in the pixel block 60 may be first added together and then the sum may be multiplied by 8/5 to obtain an imaging signal representing the four pixels in the pixel block 60.

It is to be noted that the imaging signals individually output from the four imaging pixels 20A in each pixel block made up with for imaging pixels 20A are added together inside the solid-state image sensor 3 or outside the solid-state image sensor 3. The signal representing the sum is then used as image information for the particular pixel block.

Figure 10:
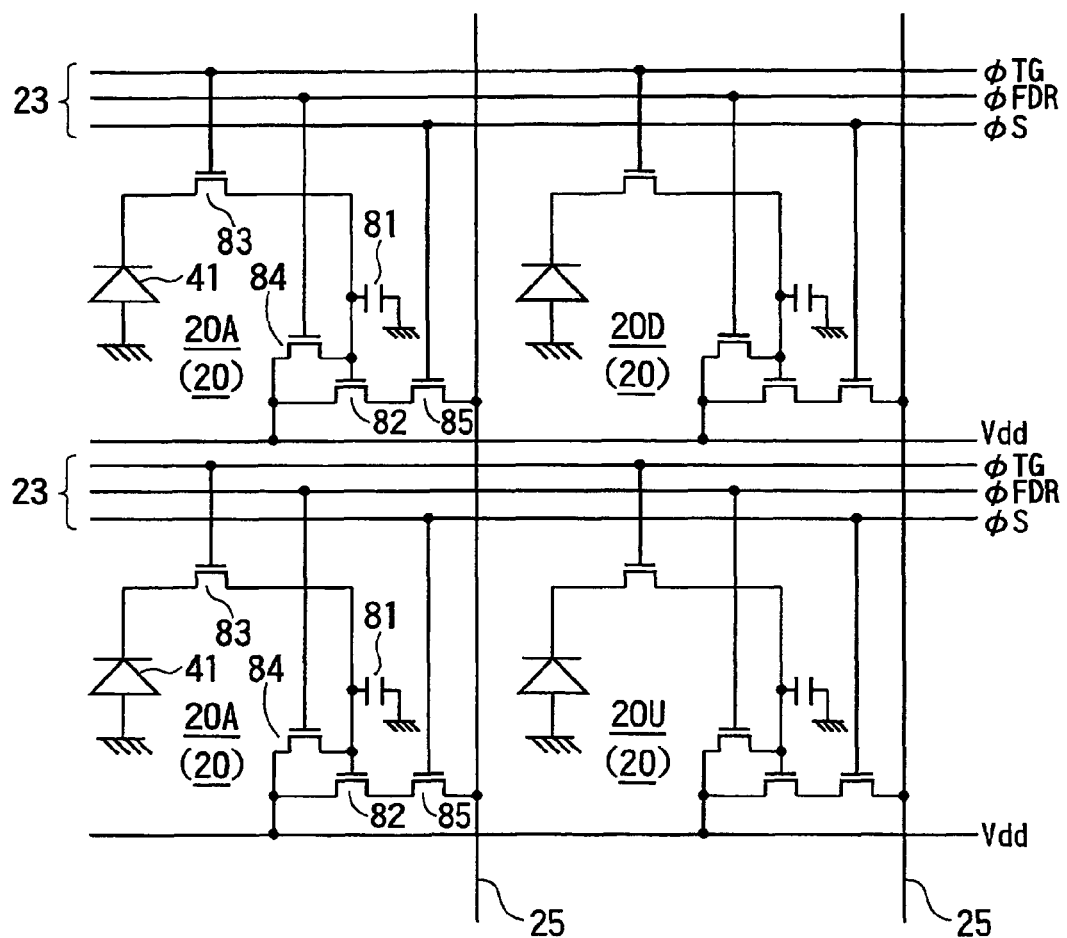
FIG. 10 shows a circuit diagram of a single pixel block made up with 2×2 pixels in the solid-state image sensor shown in FIG. 1.

FIG. 10 is a circuit diagram pertaining to a pixel area with 2×2=4 pixels 20 forming a single pixel block at the solid-state image sensor 3 in FIG. 1. FIG. 10 shows the pixel block including part of the focus detection area 33 (see FIG. 4), namely, including two AF pixels 20F (an AF pixel 20U and an AF pixel 20D) and two imaging pixels 20A.

The pixels 20 (the imaging pixels 20A and the AF pixels 20R, 20L, 20U and 20D) in the embodiment all assume identical circuit structures. Each pixel 20 is constituted with a photodiode 41 functioning as a photoelectric conversion unit at which an electrical charge corresponding to the incoming light is generated, a floating diffusion (FD) 81 functioning as a charge/voltage conversion unit that takes in the electrical charge described above and converts the charge to a voltage, a pixel amplifier 82 functioning as an amplifier unit that outputs a signal corresponding to the potential at the FD 81, a transfer transistor 83 functioning as a charge transfer unit that transfers the electrical charge from the photodiode 41 to the FD 81, a reset transistor 84 functioning as a reset unit that resets the potential at the FD 81 and a selector transistor 85 functioning as a selector unit via which the particular pixel 20 is selected. It is to be noted that Vdd in FIG. 10 indicates a power source. Such a circuit structure assumed at the pixels 20 is a standard circuit structure for pixels each constituting a structural unit in a CMOS solid-state image sensor.

The transfer transistor 83, the pixel amplifier 82, the reset transistor 84 and the selector transistor 85 in the embodiment are each constituted with an NMOS transistor.

The gate electrodes of the transfer transistors 83 at the individual pixels 20 in each pixel row are commonly connected and a drive signal ØTG is provided from the vertical scanning circuit 21 to the pixels 20 in the particular row via corresponding the drive wiring 23. The gate electrodes of the selector transistor 85 at the individual pixels 20 in each pixel row are commonly connected, and a drive signal ØS is provided to the pixels from the vertical scanning circuit 21 via the corresponding drive wiring 23. The gate electrodes at the reset transistors 84 at the individual pixels 20 in each row are commonly connected to the corresponding drive wiring 23 and a drive signal ØFDR is provided to the pixels from the vertical scanning circuit 21 via the drive wiring 23.

Figure 11:
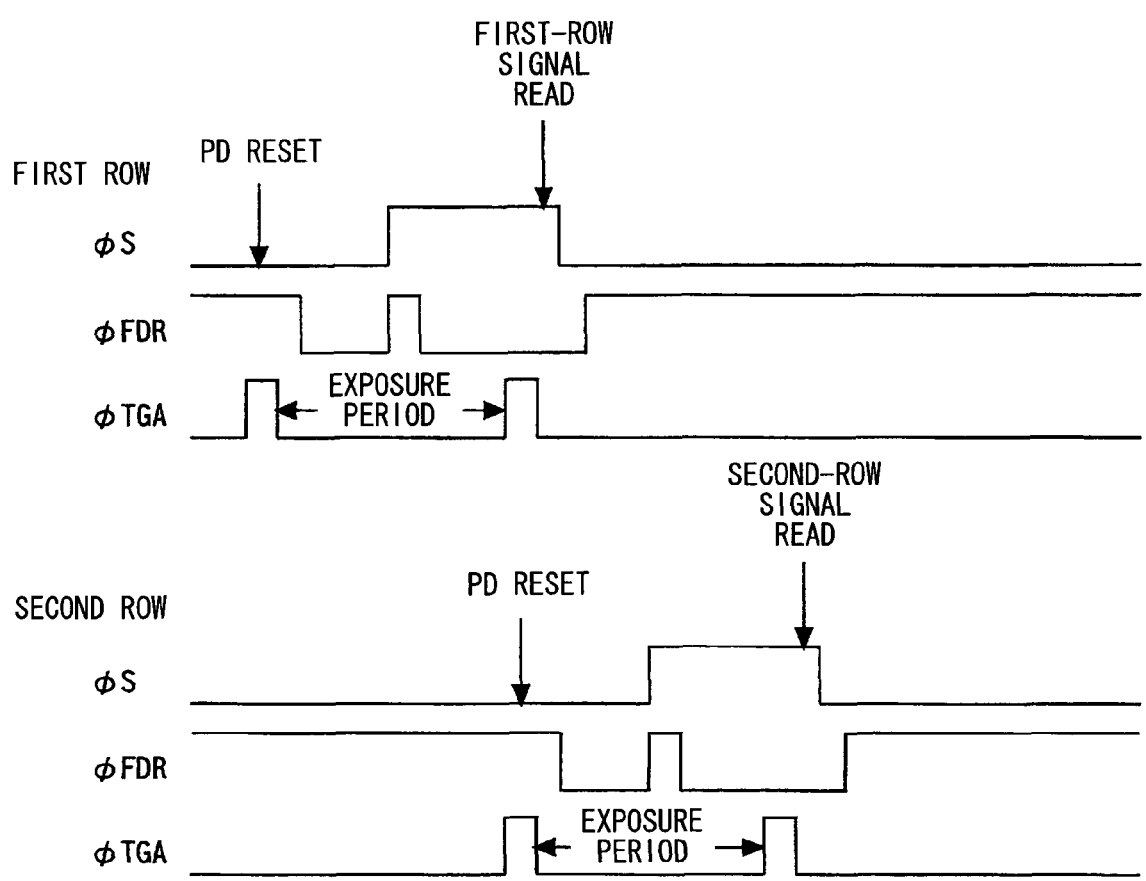
FIG. 11 shows a timing chart for an operation that may be executed in the solid-state image sensor in FIG. 1.

FIG. 11 presents a timing chart of an operation that may be executed at the solid-state image sensor 3. In this example, the solid-state image sensor 3 is driven to function as a rolling shutter. It is to be noted that while the following description related to an imaging signal output operation, the operation executed to output focus detection signals is basically identical except that the focus detection signals are read out from specific limited areas (rows and columns).

First, ØTG is set to high and then switched to low, thereby resetting the photodiodes 41, while ØFDR for the selected row is sustained at high-level. After a predetermined length of time elapses, ØS is set to high, and thus, the selector transistors 85 corresponding to the selected row are turned on. Following the time point at which ØS is switched to high, ØFDR is sustained at high level for a specific length of time so as to reset the level at the FDs 81 to a reference level, and then, ØFDR is set to low. Subsequently, signals at a level (dark level) corresponding to the reference level for the FDs 81, output from the pixel amplifiers 82, are stored into the CDS circuit 27 via the corresponding vertical signal line 25.

Next, ØTG is set to high and then switched to low again. This prompts transfer of the charges accumulated at the photodiodes 41 to the FD 81. Then, signals at a level corresponding to that of signals obtained by superimposing the charge signals having been transferred from the FDs 81 over the reference level signal, output from the pixel amplifiers 82, are stored into the CDS circuits 27 via the vertical signal lines 25. Then, imaging signals each corresponding to a level determined by taking the difference between the level of the stored signal and the dark level mentioned earlier at the corresponding CDS circuit 27, are output. The imaging signals thus obtained in correspondence to the individual columns are then output in sequence to the horizontal signal line. After this, the next row is selected and signals are output in a similar manner.

Figure 12:
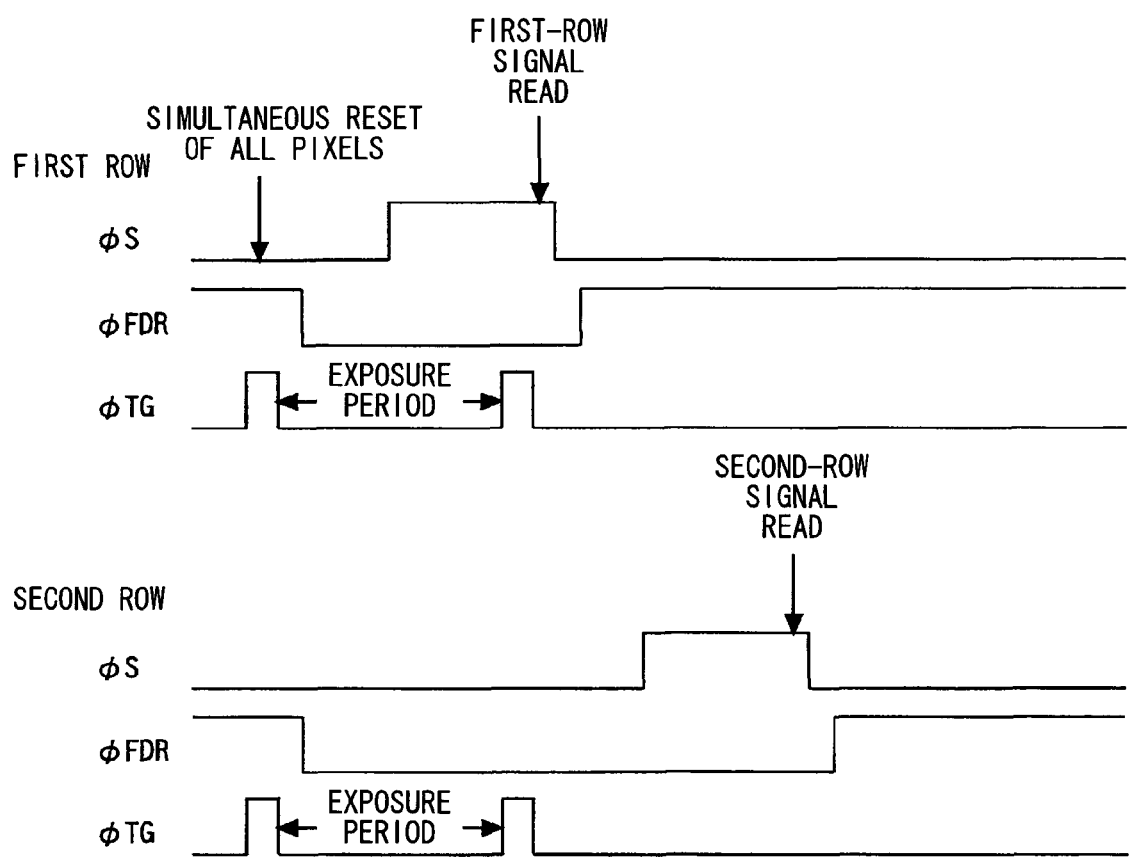
FIG. 12 shows a timing chart for another operation that may be executed in the solid-state image sensor in FIG. 1.

FIG. 12 provides a timing chart of another operation that may be executed at the solid-state image sensor 3. In this example, the pixels are exposed all at once. While ØFDR corresponding to all the rows is sustained at high level, ØTG is set to high in correspondence to all the rows. As a result, the electrical charges having been accumulated at the photodiodes 41 at all the pixels 20 are simultaneously reset. It is to be noted that the period of time elapsing following the time point at which ØTG is switched to low up to the time point at which ØTG is switched back to high is the exposure period.

After a predetermined length of time has elapsed, ØS for the selected row is set to high. Then, ØTG is switched to high and then switched to low again (this operation is executed simultaneously for all the rows). As a result, the electrical charges having been stored at the photodiodes 41 in all the rows are simultaneously transferred to the respective FDs 81. In the selected row, signals each assuming a level corresponding to the matching charge signal, are output from the pixel amplifiers 82, and are stored into the CDS circuits 27 via the vertical signal lines 25. In this operation, the CDS circuits 27 do not execute correlated double sampling processing (CDS processing) based upon the dark level but instead simply function as circuits where signals each assuming a level corresponding to a specific charge signal are temporarily stored. The imaging signals thus obtained in correspondence to the individual columns are then output in sequence to the horizontal signal line. After this, the next row is selected and signals are output in a similar manner.

The example is described by assuming that no CDS processing is executed so as to simplify the explanation. However, it will be obvious that it is more desirable to execute CDS processing when all the pixels are simultaneously exposed. In this case, as described in Japanese Laid Patent Publication No. H11-177076, each pixel may include a storage unit (capacitor) where the electrical charge from the photodiode 41 is temporarily stored, disposed between the photodiode 41 and the FD 81 and a first transfer transistor that transfers the electrical charge from the photodiode 41 to the storage unit and a second transfer transistor that transfers the electrical charge from the storage unit to the FD 81, disposed in place of the transfer transistor 83.

An example of an operation that may be executed in the electronic camera 1 in the embodiment is now described.

As the shutter release button in the operation unit 9*a* is pressed halfway down, the microprocessor 9 in the electronic camera 1 drives the imaging control unit 4 in synchronization with the halfway press operation. In order to verify the subject, the imaging control unit 4 reads out the imaging signals to be used for subject verification from all the imaging pixels 20A or from specific pixels among the imaging pixels 20A and stores the imaging signals thus read out into the memory 7 through a predetermined method of the known art. At this time, if the imaging signals from all the pixels are read out, an operation similar to that having been described in reference to FIG. 11 or FIG. 12 should be executed. The image processing unit 13 recognizes, through image recognition technology, the subject based upon the signals having been read out. For instance, if a face recognition mode is selected, a face is recognized as the subject. At this time, the image processing unit 13 ascertains the position and the shape of the subject.

Based upon the position and the shape of the subject having been ascertained, the microprocessor 9 selects the optimal focus detection area where the focusing condition can be detected with a high level of accuracy in correspondence to the particular subject, among the focus detection areas 32~37. It is to be noted that the focus detection area thus selected corresponds to an autofocus line sensor. In addition, based upon the recognition results and the like, the microprocessor 9 sets photographing conditions for the focus detection (e.g., the aperture, the focus adjustment condition, the shutter speed and the like).

Then, the microprocessor 9 engages the lens control unit 2*a* in operation so as to achieve the conditions having been set earlier including the selected aperture condition setting. The microprocessor 9 drives the imaging control unit 4 under the conditions having been selected including the selected shutter speed, based upon the pixel column coordinates corresponding to the AF pixels 20F in the selected focus detection area, so as to read out the focus detection signals and then stores the focus detection signals thus read out into the memory 7. At this time, the focus detection signals are read out through an operation similar to that described in reference to FIG. 11 or FIG. 12.

Next, the microprocessor 9 picks up the focus detection signals output from the AF pixels 20F in the selected focus detection area among the signals corresponding to all the pixels having been obtained and stored into the memory 7. The microprocessor 9 engages the focus detection calculation unit 10 in arithmetic operation (focusing condition detection processing) based upon the signals having been picked up through the split-pupil phase-difference method and the focus detection calculations unit 10 thus calculates the defocus quantity.

The microprocessor 9 next engages the lens control unit 2*a* in adjustment of the photographic lens 2 so as to achieve a focus match state based upon the calculated defocus amount. Then, the microprocessor 9 selects optimal photographing conditions (the aperture, shutter speed and the like) for the main photographing operation.

Next, the microprocessor 9 engages the lens control unit 2*a* in operation so as to achieve the conditions such as the aperture setting having been selected for the main operation. In synchronization with a full press operation of the shutter release button at the operation unit 9*a*, the microprocessor 9 drives the imaging control unit 4 under the conditions having been selected for the main photographing operation including the specific shutter speed setting and reads out image signals through the main photographing operation. At this time, the imaging signals are read out through an operation similar to that described in reference to FIG. 11 or FIG. 12. The imaging signals are then stored into the memory 7 by the imaging control unit 4.

Subsequently, the microprocessor 9 engages the image processing unit 13 in processing (which includes the interpolation processing) to obtain an image signal representing the four pixels in each pixel block as explained earlier and the imaging signals thus obtained are stored as image signals into the memory 7.

Then, in response to a command issued from the operation unit 9*a*, the microprocessor 9 executes desired processing as required at the image processing unit 13 or the image compression unit 12 and outputs the signals having undergone the processing to the recording unit so as to record them into the recording medium 11*a*.

Through the embodiment described above, a better quality image can be obtained by improving the accuracy of the interpolation executed for the AF pixels 20F.

Second Embodiment

Figure 14:
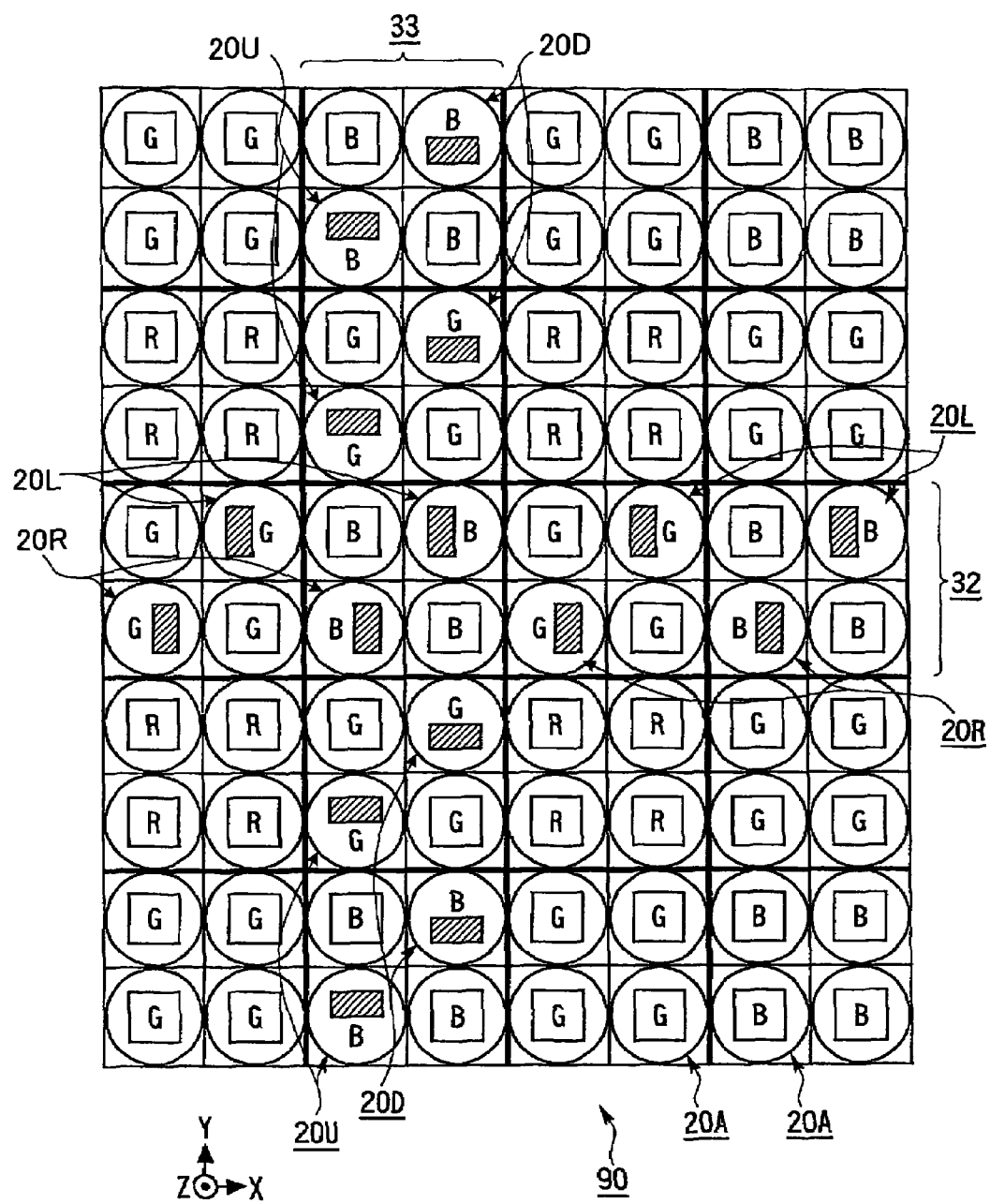
FIG. 14 shows a schematic plan view showing, in a partial enlargement, the pixel arrangement adopted in the solid-state image sensor in the electronic camera achieved in a second embodiment of the present invention.

FIG. 14, which corresponds to FIG. 4, is a schematic plan view showing in a partial enlargement the pixel arrangement adopted in a solid-state image sensor 90 in the electronic camera achieved in the second embodiment of the present invention. In FIG. 14, the same reference numerals are assigned to elements identical to or corresponding to those in FIG. 4 to preclude the necessity for a repeated explanation thereof.

The embodiment differs from the first embodiment in that the solid-state image sensor 90 is used in place of the solid-state image sensor 3. The following features of the solid-state image sensor 90 differentiate it from the solid-state image sensor 3. It is to be noted that while the focus detection areas 34~37 are mentioned below, their illustration is not provided.

While the focus detection areas 32, 36 and 37 ranging along the X axis are each made up with pixels disposed in a single row and the pixel areas 33~35 ranging along the Y axis are each made up with pixels disposed in a single column at the solid-state image sensor 3, the focus detection areas 32, 36 and 37 are each made up with pixels present over two rows and the focus detection areas 33~35 are each made up with pixels present over two columns at the solid-state image sensor 90.

The AF pixels 20F at the solid-state image sensor 3 are disposed along a straight line taking up consecutive positions in sequence within the same row or column to be included in two or more pixel blocks in each of the focus detection areas 32~37 at the solid-state image sensor 3. The AF pixels 20R and 20L at the solid-state image sensor 90, on the other hand, are disposed to form a zigzag pattern over two adjacent rows to be included in two or more pixel blocks set side-by-side along the X axis in each of the focus detection areas 32, 36 and 37. In addition, the AF pixels 20U and 20D are disposed to form a zigzag pattern over two adjacent columns to be included in two or more pixel blocks set side-by-side along the Y axis in each of the focus detection areas 33~35.

The embodiment achieves advantages basically similar to those of the first embodiment. In addition, since the AF pixels 20F in each focus detection area are disposed to form a zigzag pattern over two rows or columns in the embodiment, even better image quality than that achieved in the first embodiment is assured, albeit with the focus detection accuracy somewhat compromised compared to that achieved in the first embodiment. Namely, if a subject image expressing a line extending along the X axis over a width corresponding to a single row is formed above the focus detection area 32 assuming the one-row width in FIG. 4, the subject line cannot be detected via the solid-state image sensor 3. However, even if a subject image expressing a line extending along the X axis over a one-row width is formed exactly over an area having a one-row width within the focus detection area 32 in FIG. 4, the solid-state image sensor 90 is able to detect the subject line at the imaging pixels 20A each disposed to assume every other pixel position within the single-row area, assuring better image quality.

Third Embodiment

Figure 15:
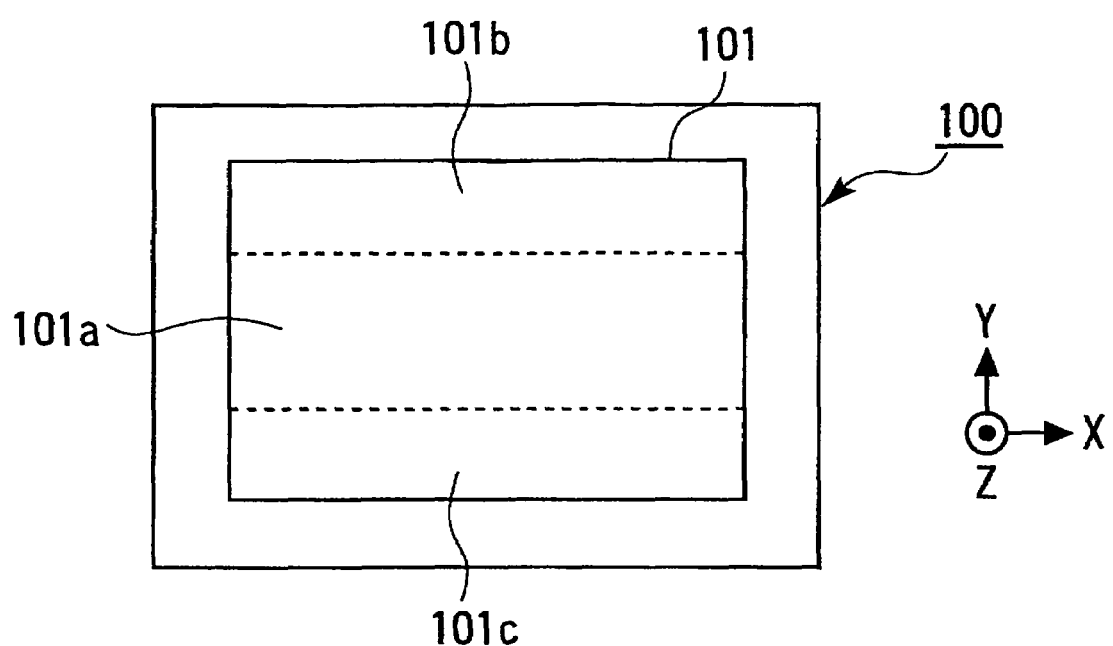
FIG. 15 shows a schematic plan view of the solid-state image sensor in the electronic camera achieved in a third embodiment of the present invention.
Figure 16:
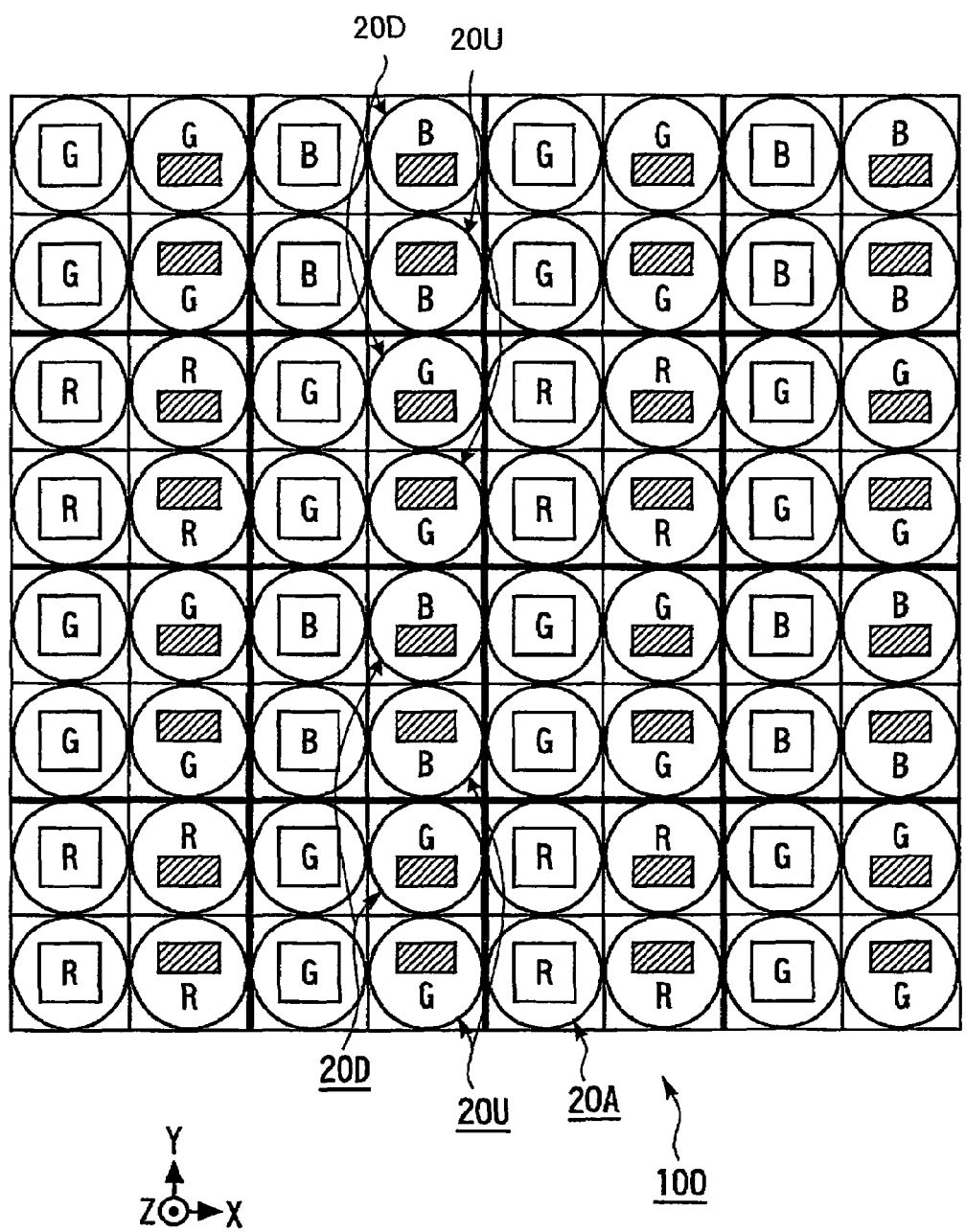
FIG. 16 shows a schematic plan view, showing in a partial enlargement, the pixel arrangement adopted in the solid-state image sensor in FIG. 15.
Figure 17:
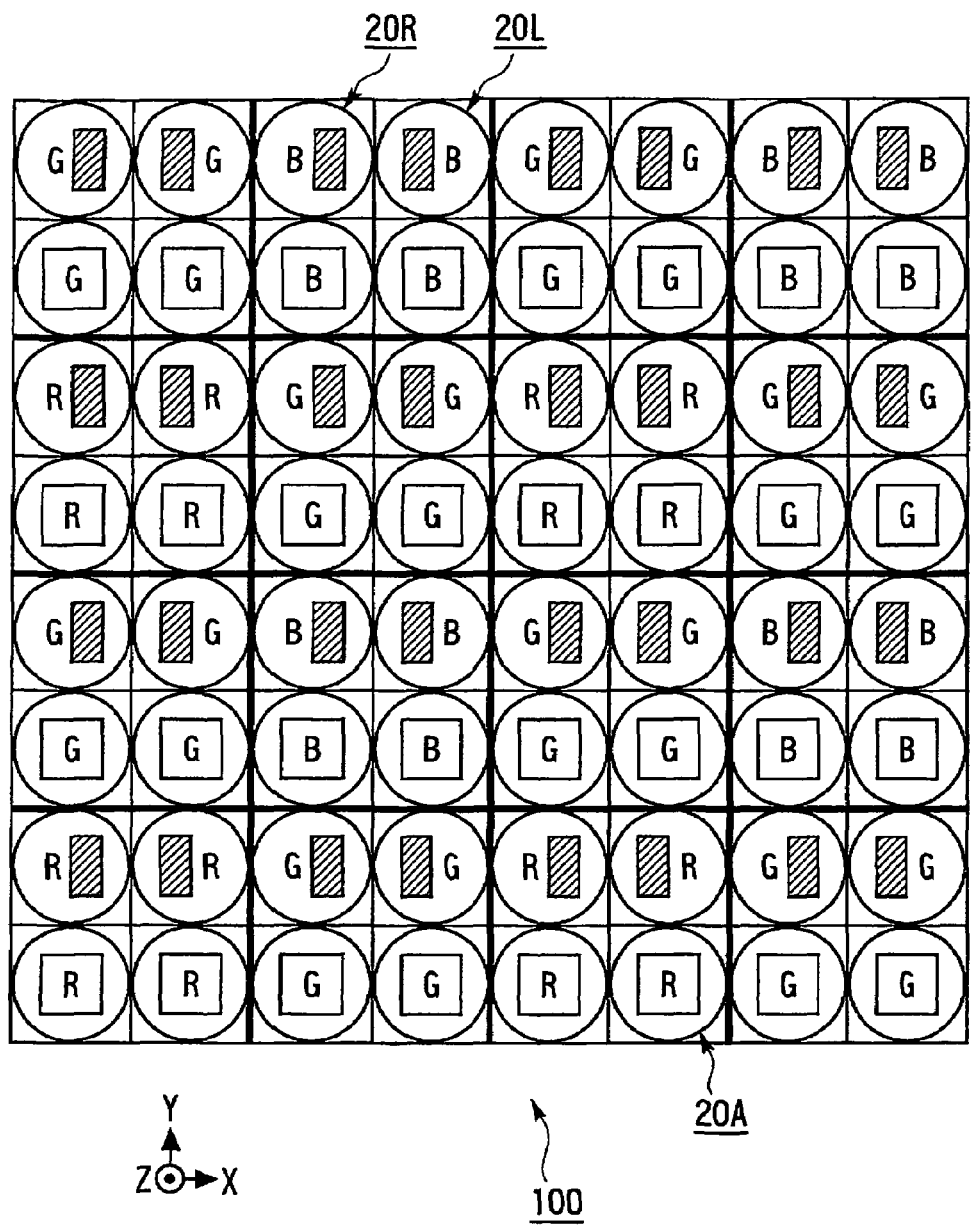
FIG. 17 shows a schematic plan view, showing in another partial enlargement, the pixel arrangement adopted in the solid-state image sensor in FIG. 15.
Figure 18:
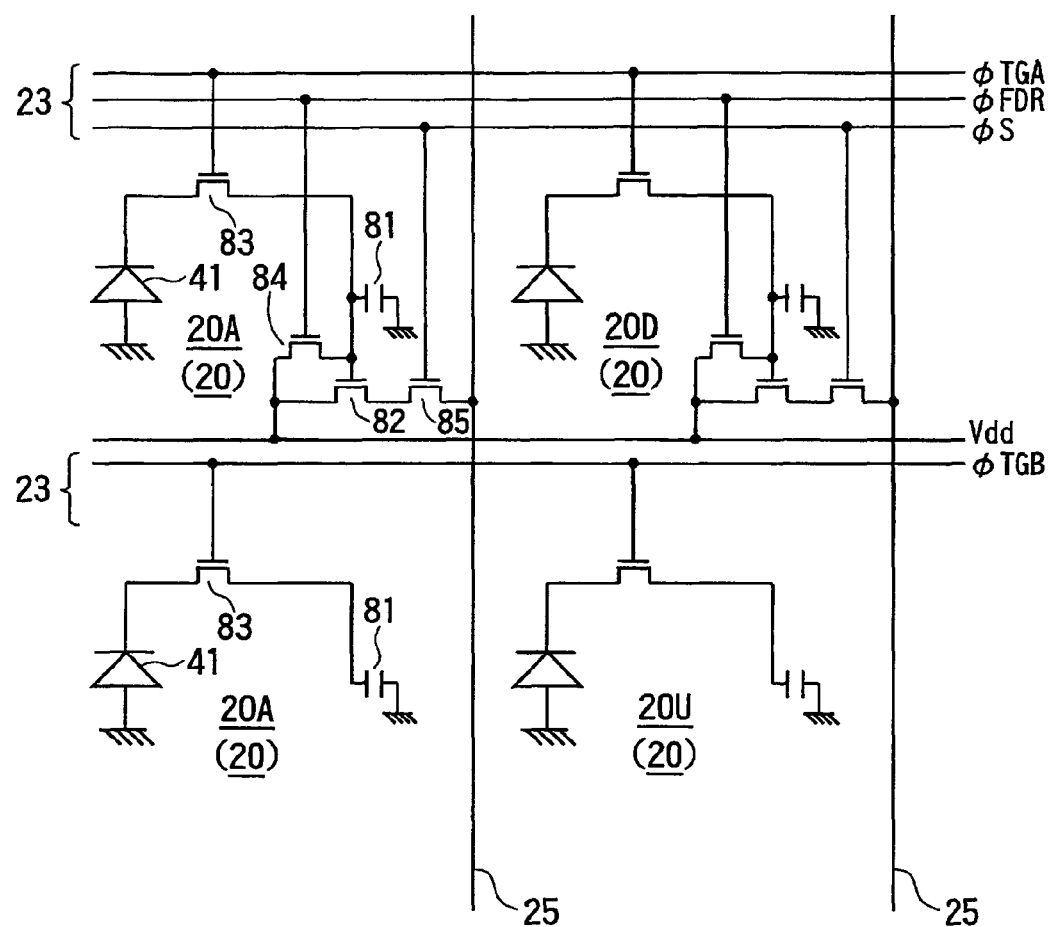
FIG. 18 shows a circuit diagram of a single pixel block made up with 2×2 pixels in the solid-state image sensor shown in FIG. 15.

FIG. 15, which corresponds to FIG. 3, is a schematic plan view of a solid-state image sensor 100 (more specifically its effective pixel area 101) in the electronic camera achieved in the third embodiment of the present invention. FIGS. 16 and 17, corresponding to FIG. 4, each present a schematic plan view showing in a partial enlargement, the pixel arrangement adopted in the solid-state image sensor 100. FIG. 16 shows part of a middle area 101*a* in the effective pixel area 101 at the solid-state image sensor 100 in FIG. 15, whereas FIG. 17 shows part of an upper area 101*b* or a lower area 101*c* of the effective pixel area 101. FIG. 18, which corresponds to FIG. 10, is a circuit diagram assumed in each pixel block made up with 2×2 pixels 20 at the solid-state image sensor 100. In FIGS. 15 through 18, the same reference numerals are assigned to elements identical to or corresponding to the elements in FIGS. 4 and 10 so as to preclude the necessity for a repeated explanation thereof.

The embodiment differs from the first embodiment in that the solid-state image sensor 100 is used in place of the solid-state image sensor 3. The following features of the solid-state image sensor 100 differentiate it from the solid-state image sensor 3.

At the solid-state image sensor 100, focus detection areas set at fixed positions in advance, such as those shown in FIG. 3, are not formed in its effective pixel area 101 but instead, pixel blocks that include AF pixels 20F are disposed in a two-dimensional pattern over the entire effective pixel area 101. As shown in FIG. 16, over the middle area 101*a* of the effective pixel area 101, pixel blocks each made up with two AF pixels 20F (an AF pixel 20U and an AF pixel 20D) and two image imaging pixels 20A are disposed in a two-dimensional pattern. In the middle area 101*a*, AF pixels 20U and 20D are disposed along a straight line, taking up alternate positions in every other column. In the upper area 101*b* and the lower area 101*c* of the effective pixel area 101, pixel blocks each made up with two AF pixels 20F (an AF pixel 20R and an AF pixel 20L) and two imaging pixels 20A are disposed in a two-dimensional pattern as shown in FIG. 17. In the upper area 101*b*, and the lower area 101*c*, AF pixels 20R and 20L are disposed along a straight line, taking up alternate positions in every other row. It is to be noted that since the AF pixels 20F are disposed side-by-side in sequence along a straight line in the same row or column, better focus detection accuracy is assured.

As described above, pixel blocks that include AF pixels 20F are disposed over the entire effective pixel area 101 in the embodiment. Thus, the focusing condition can be detected based upon the signals from AF pixels 20F occupying a desirable position in the effective pixel area 101 in correspondence to a specific subject, i.e., occupying the optimal position corresponding to the subject. As a result, an improvement in the focus detection accuracy is achieved. The advantages described above may be achieved by disposing pixel blocks that include AF pixels 20F over most of the effective pixel area 101 as well. For instance, the pixel blocks located along the periphery of the effective pixel area 101 at the solid-state image sensor 100 may be replaced with pixel blocks each made up with four imaging pixels 20A. Advantages similar to those of the solid-state image sensor 100 will also be achieved by adopting such an alternative structure.

In addition, while the AF pixels 20F are distributed over the entire effective pixel area 101 in the embodiment, the signals generated at the imaging pixels 20A set adjacent to the AF pixels 20F can be used for interpolation during imaging operation, as in the first embodiment. Consequently, the accuracy of the interpolation executed for the AF pixels 20F is improved and ultimately, a high-quality image can be provided.

The individual pixels 20 disposed by adopting the pixel arrangement described above may assume a circuit structure identical to that having been described in reference to the first embodiment. However, the two pixels 20 in the same column at each pixel block share a single output unit, as shown in FIG. 18. Namely, the two pixels 20 set side-by-side along the Y axis in each pixel block share a common set of components, i.e., a common selector transistor 84, a common reset transistor 82 and a common pixel amplifier 85. While an FD 81 is disposed at each pixel 20, the FDs 81 are both connected to a gate electrode 84 of the same pixel amplifier 84 and thus, overall, the FDs 81 together function as a single floating diffusion. Accordingly, the two pixels 20 can be considered to share a single floating diffusion (charge/voltage conversion unit) as well. It is to be noted that FIG. 18 shows a given pixel block in FIG. 16, i.e., two AF pixels 20F (an AF pixel 20U and an AF pixel 20D) and two imaging pixels 20A.

It is to be noted that the gate electrodes of the transfer transistors 83 at the pixels 20 occupying the +Y-side positions in the individual pixel blocks are commonly connected in each pixel row and a drive signal ØTGA is provided from the vertical scanning circuit 21 via the corresponding drive wiring 23. The gate electrodes of the transfer transistors 83 at the pixels 20 occupying the –Y-side positions in the individual pixel blocks are commonly connected in each pixel row and a drive signal ØTGA is provided from the vertical scanning circuit 21 via the corresponding drive wiring 23.

As described above, the two pixels 20 set in the same column in each pixel block share a single output unit in the embodiment. As a result, a unique advantage related to the interpolation executed to generate signals in correspondence to the AF pixels 20F during a photographic operation, in addition to the advantage of an increase in the ratio of opening area at the photodiodes 41 achieved through the decrease in the number of output units is realized. Namely, the electrical charges originating from the photodiodes at the two pixels 20 sharing an output unit can be mixed so as to combine the pixels by simultaneously transferring the charges to the FDs 81. This enables the following processing, executed in order to obtain a photographic signal based upon the signals from the four pixels in a given pixel block, as has been explained in reference to the first embodiment. Namely, part of the addition processing can be executed automatically through the pixel combination by adding together the signals from the two AF pixels 20F and the two imaging pixels 20A in the pixel block and then multiplying the sum by 4/3. Thus, by executing a signal read so as to combine pixels as described above, the load of the addition processing executed after outputting the signals from the pixels (i.e., part of the interpolation processing) can be reduced. This point is now described in reference to FIGS. 19 and 20.

Figure 19:
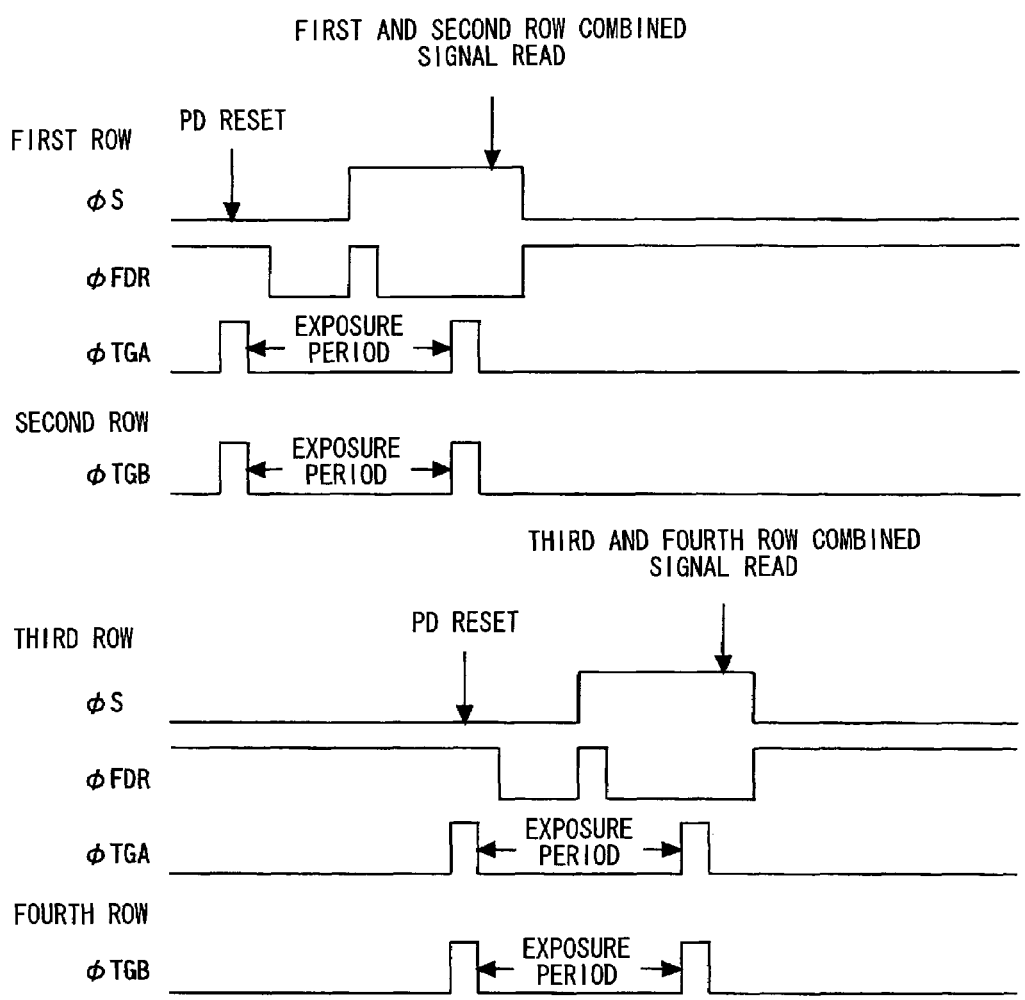
FIG. 19 shows a timing chart for an operation that may be executed in the solid-state image sensor in FIG. 1.

FIG. 19 is a timing chart of an operation that may be executed at the solid-state image sensor 100. In this example, imaging signals are obtained through pixel combination at the image sensor driven as a rolling shutter.

First, ØTGA and ØTGB for two selected rows included in the same pixel blocks are set to high and then switched to low, thereby resetting the photodiodes 41 in the two selected rows while ØFDR for the two selected rows is sustained at high-level. After a predetermined length of time elapses ØS is set to high and thus, the selector transistors 85 corresponding to the two selected rows are turned on. Following the time point at which ØS is switched to high, ØFDR for the two selected rows is sustained at a high level for a specific length of time so as to reset the level at the FDs 81 to the reference level, and then, ØFDR is set to low. Subsequently, signals, each assuming a level (dark level) corresponding to the reference level for the FDs 81, output from the pixel amplifiers 82, is stored into the CDS circuit 27 via the corresponding vertical signal lines 25.

Next, ØTGA and ØTGB are simultaneously set to high and then switched to low again. This prompts transfer of the charges accumulated at the photodiodes 41 in the two rows to the FDs 81 and the transferred charges become combined at the FD's 81. Then, signals, each assuming a level corresponding to that of a signal obtained by superimposing a signal indicating the sum of the charges having been combined via the corresponding FDs 81, over reference level the signal, output from the pixel amplifiers 82, are stored into the CDS circuits 27 via the vertical signal lines 25. Then, imaging signals, each assuming a level determined by taking the difference between the level of the stored signal and the dark level mentioned earlier at the corresponding CDS circuit 27 are output. The imaging signals thus obtained in correspondence to the individual columns are then output in sequence to the horizontal signal line. After this, the next two rows are selected and signals are output in a similar manner.

Figure 20:
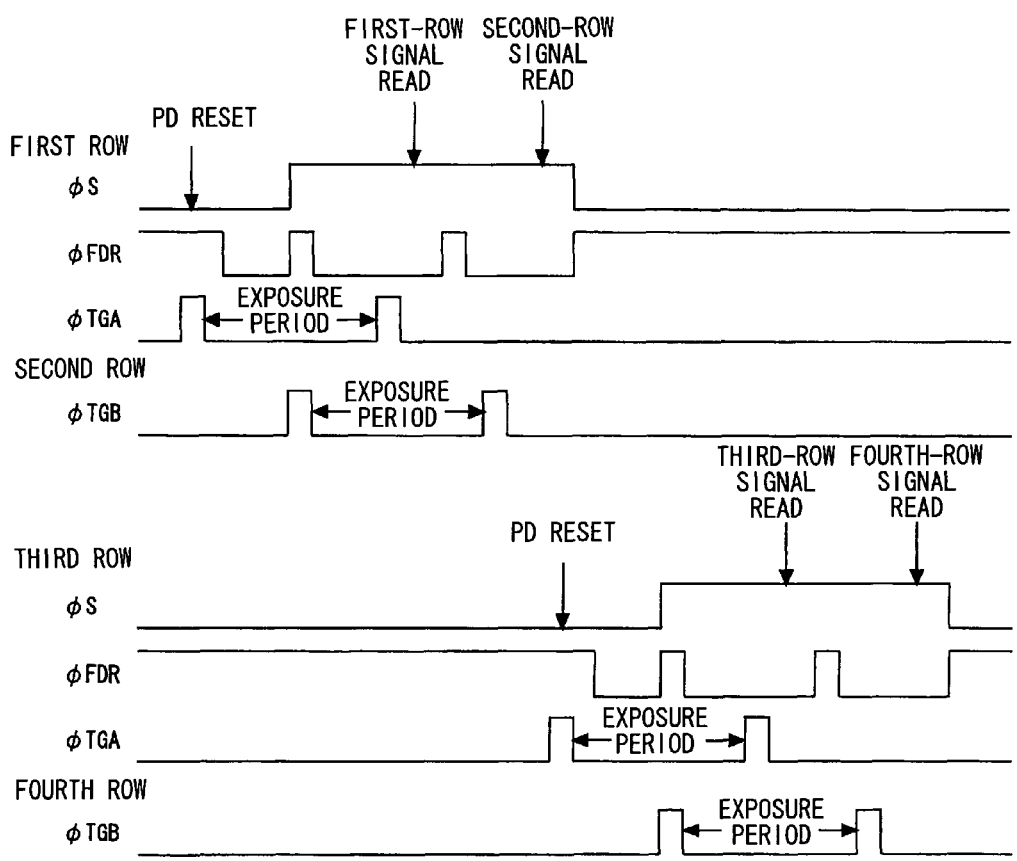
FIG. 20 shows a timing chart for another operation that may be executed in the solid-state image sensor in FIG. 1.

Focus detection signals can also be obtained without combining pixels, as explained below in reference to FIG. 20. FIG. 20 is a timing chart of another operation that may be executed at the solid-state image sensor 100. In this example, focus detection signals are obtained without combining pixels at the image sensor driven as a rolling shutter. The operation in FIG. 20 differs from the operation in FIG. 19 in that signals from the pixels present in the two rows are separately read out. It is to be noted that the signals are read out through the rolling shutter method with the exposure timing for the first row and the exposure timing for the second row offset relative to each other in the operation shown in FIG. 20. However, if this is undesirable, ØTGA and ØTGB may be initially set to high and then to low with matching timing. In such a case, since the timing with which ØTGA is set to high and then to low, and the timing with which ØTGB is set to high and then to low for the first row and the second row for the last time, are somewhat offset, and thus, the exposure timing for the first row and the exposure timing for the second row do not exactly match. However, the time lag is insignificant and poses no risk of causing erroneous autofocus operation.

It is to be noted that pixel blocks each made up with two AF pixels 20F (an AF pixels 20U and an AF pixel 20D) and two imaging pixels 20A may be disposed in a two-dimensional pattern, as shown in FIG. 16, over the entire effective pixel area 101. In such a case, each imaging pixel 20A will be combined with the other imaging pixel 20A alone and an imaging pixel 20A and an AF pixel 20F are never combined with each other. Thus, no color filters 50 need to be disposed at the AF pixels 20F in an image sensor adopting this structure.

Fourth Embodiment

Figure 21:
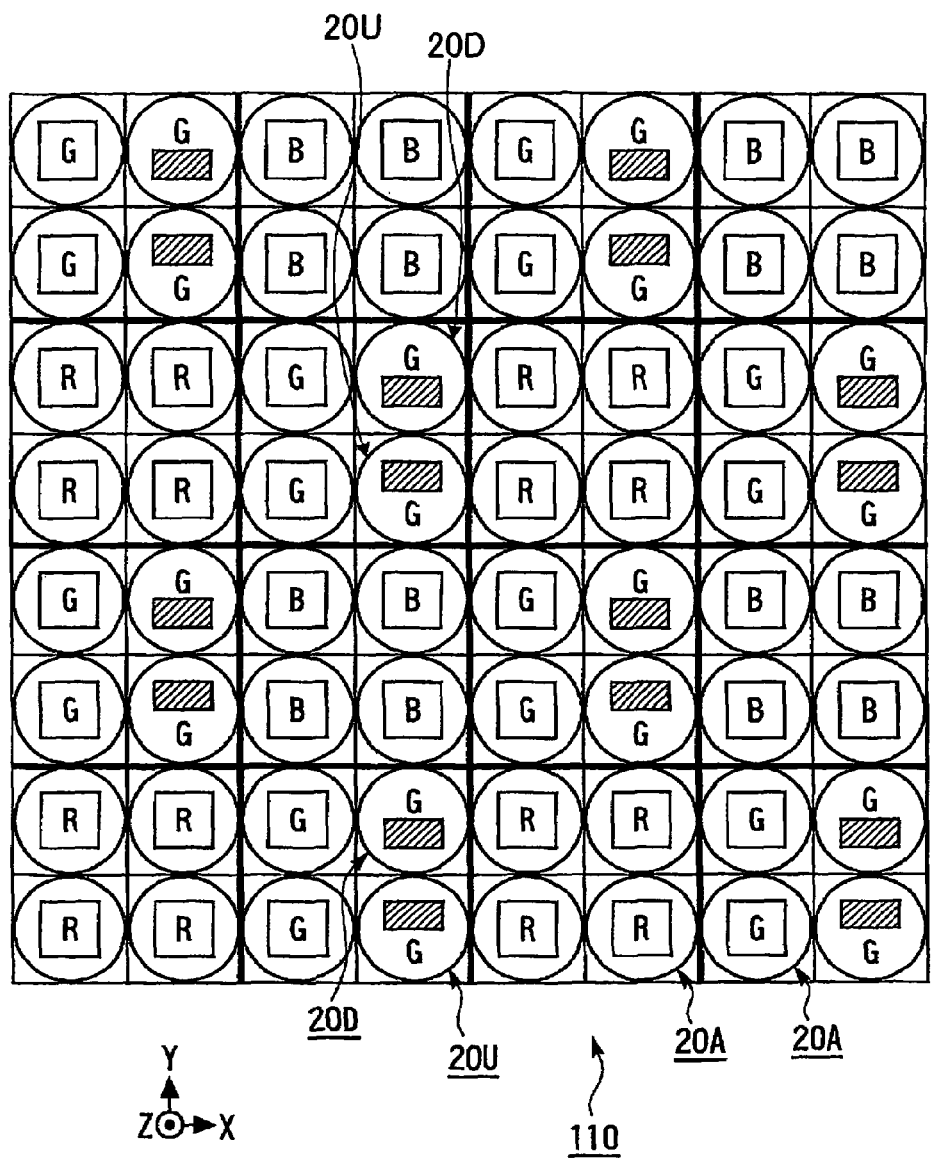
FIG. 21 shows a schematic plan view showing, in a partial enlargement, the pixel arrangement adopted in the solid-state image sensor in the electronic camera achieved in a fourth embodiment of the present invention.
Figure 22:
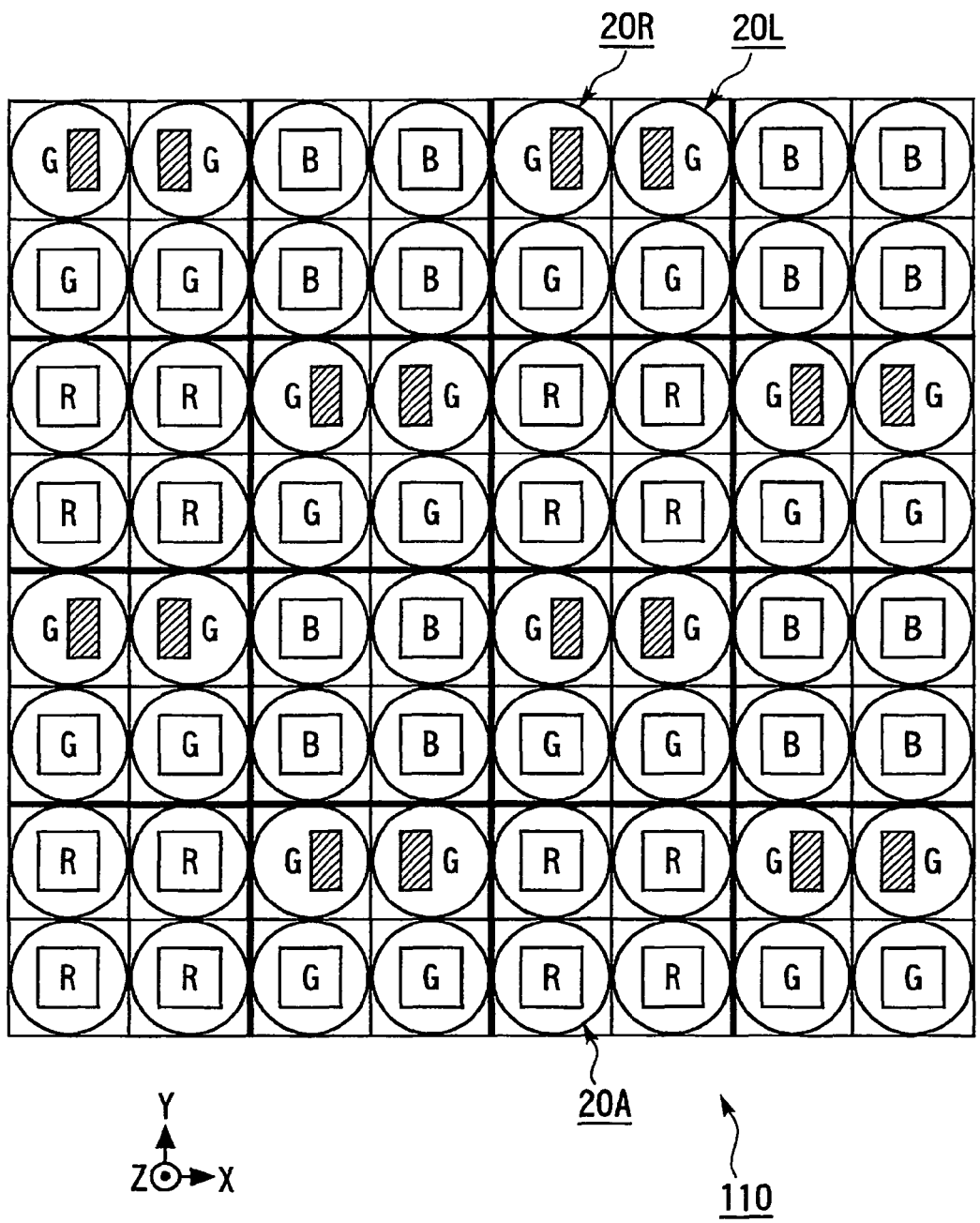
FIG. 22 shows a schematic plan view showing, in another partial enlargement, the pixel arrangement adopted in the solid-state image sensor in the electronic camera achieved in the fourth embodiment of the present invention.

FIGS. 21 and 22, corresponding to FIG. 4, each present a schematic plan view showing in a partial enlargement the pixel arrangement adopted in a solid-state image sensor 110 in the electronic camera achieved in the fourth embodiment of the present invention. FIG. 21 shows part of a middle area (equivalent to the middle area 101a in FIG. 15) in the effective pixel area at the solid-state image sensor 110, whereas FIG. 22 shows part of an upper area (equivalent to the upper area 101b in FIG. 15) or a lower area (equivalent to the lower area 101c in FIG. 15) in the effective pixel area at the solid-state image sensor 110. In FIGS. 21 and 22, the same reference numerals are assigned to elements identical to or corresponding to the elements in FIG. 4 so as to preclude the necessity for a repeated explanation thereof.

The embodiment differs from the first embodiment in that the solid-state image sensor 110 is used in place of the solid-state image sensor 3. The following features of the solid-state image sensor 110 differentiate it from the solid-state image sensor 3.

At the solid-state image sensor 110, focus detection areas such as those shown in FIG. 3 are not set at pre-fixed positions in its effective pixel area but instead, pixel blocks that include AF pixels 20F are disposed in a two-dimensional pattern over the entire effective pixel area. In the middle area (equivalent to the middle area 101a in FIG. 15) of the effective pixel area, AF pixels 20U and 20D are disposed in G pixel blocks alone. In the upper area (equivalent to the lower area 101b in FIG. 15) and the lower area (equivalent to the upper area 101c in FIG. 15) of the effective pixel area, AF pixels 20R and 20L are disposed in G pixel blocks alone.

Since the AF pixels 20F are distributed over the entire effective pixel area in the embodiment, the focusing condition can be detected based upon the signals from AF pixels 20F occupying a desirable position in the effective pixel area 101 in correspondence to a specific subject, i.e., occupying the optimal position corresponding to the subject. As a result, an improvement in the focus detection accuracy is achieved.

While the AF pixels 20F are distributed over the entire effective pixel area in the embodiment, the signals generated at the imaging pixels 20A set adjacent to the AF pixels 20F can be used for interpolation during imaging operation as in the first embodiment. Consequently, the accuracy of the interpolation executed for the AF pixels 20F is improved and ultimately, a high-quality image can be obtained.

It is to be noted that AF pixels 20F may be disposed in B pixel blocks alone instead of disposing AF pixels 20F in the G pixel blocks alone as in the embodiment, and as a further alternative, AF pixels 20F may be disposed in R pixel blocks alone.

Fifth Embodiment

Figure 23:
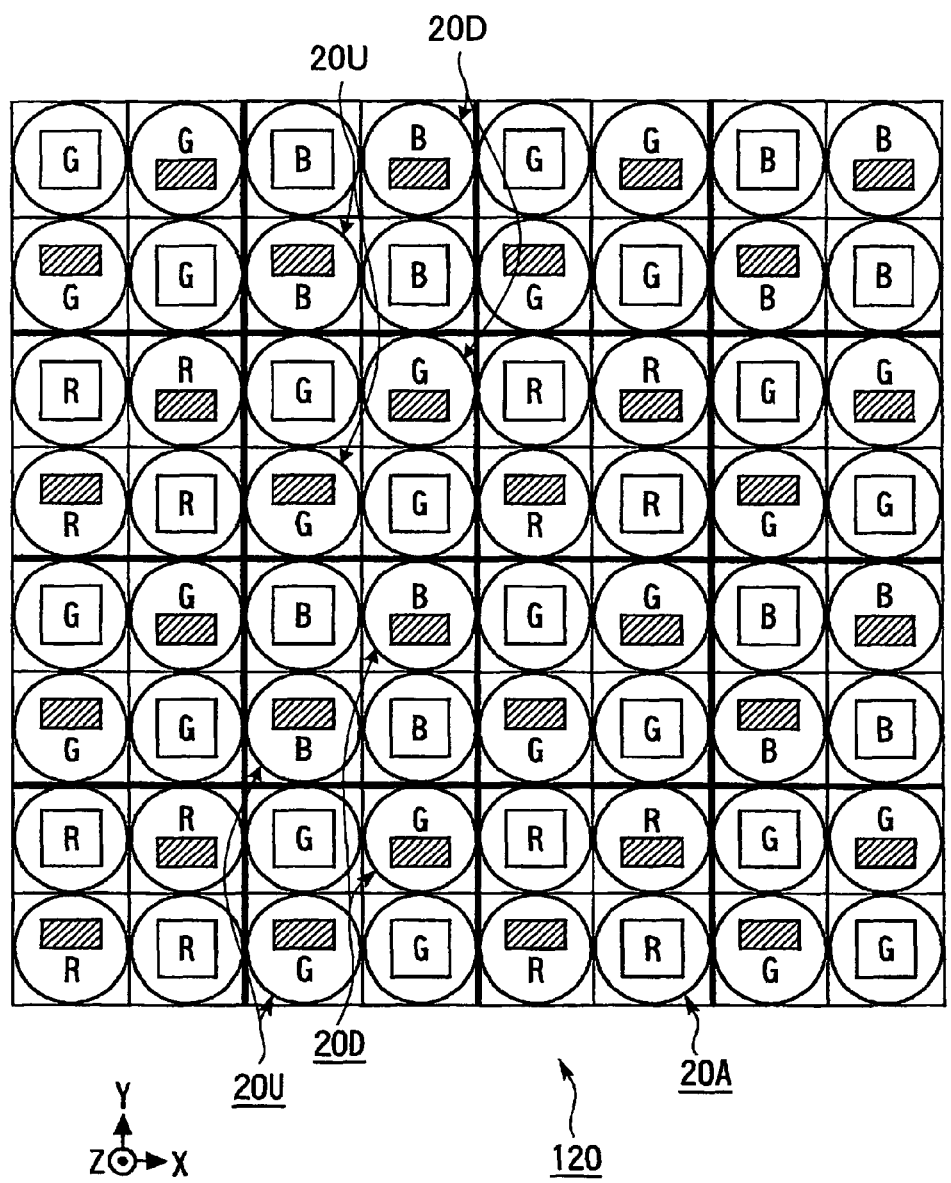
FIG. 23 shows a schematic plan view showing, in a partial enlargement, the pixel arrangement adopted in the solid-state image sensor in the electronic camera achieved in a fifth embodiment of the present invention.
Figure 24:
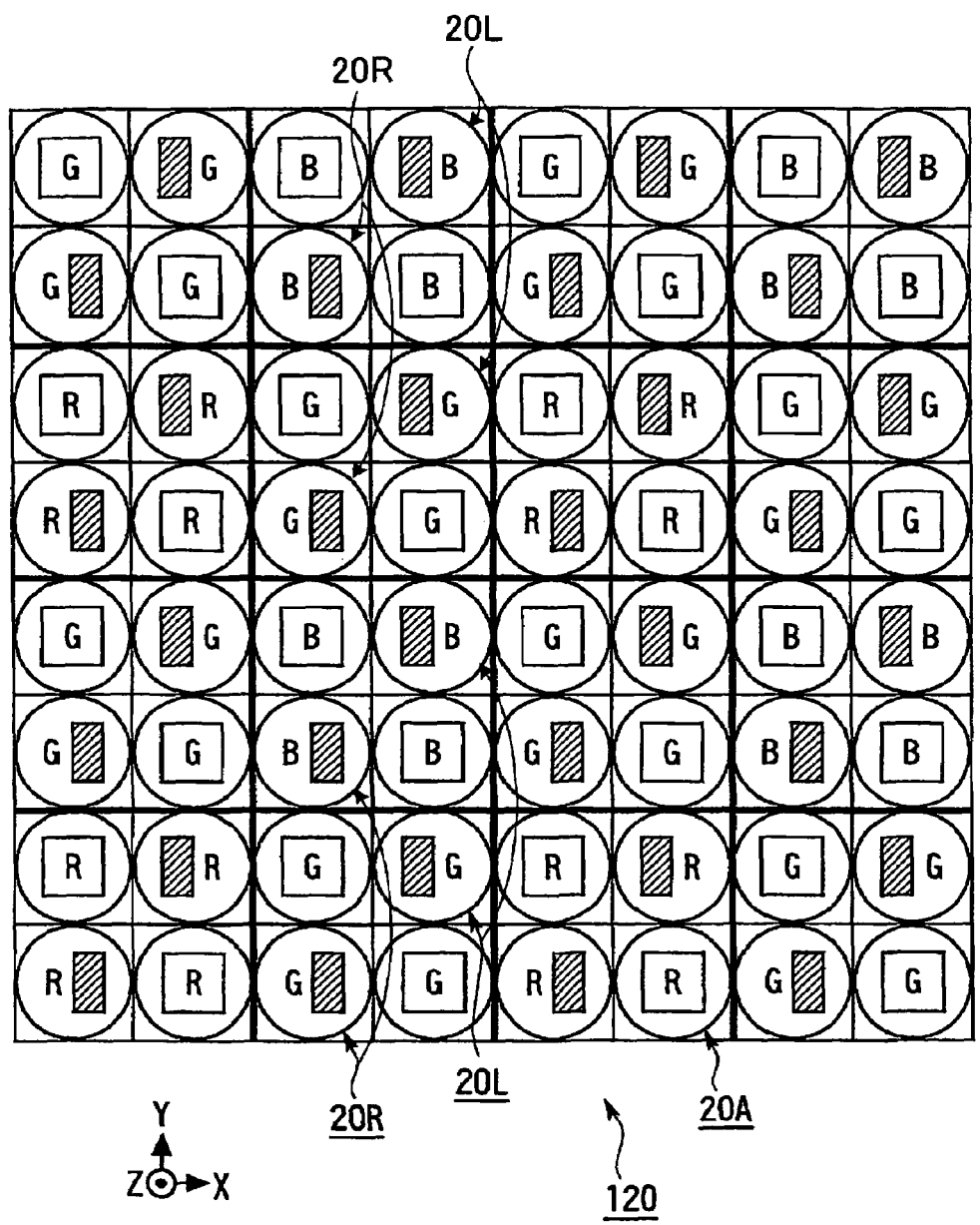
FIG. 24 shows a schematic plan view showing, in another partial enlargement, the pixel arrangement adopted in the solid-state image sensor in the electronic camera achieved in the fifth embodiment of the present invention.

FIGS. 23 and 24, corresponding to FIG. 4, each present a schematic plan view, showing in a partial enlargement the pixel arrangement adopted in a solid-state image sensor 120 in the electronic camera achieved in the fifth embodiment of the present invention. FIG. 23 shows part of a middle area (equivalent to the middle area 101a in FIG. 15) in the effective pixel area at the solid-state image sensor 120. FIG. 24 shows part of an upper area (equivalent to the upper area 101b in FIG. 15) or a lower area (equivalent to the lower area 101c in FIG. 15) in the effective pixel area at the solid-state image sensor 120. In FIGS. 23 and 24, the same reference numerals are assigned to elements identical to or corresponding to the elements in FIG. 4 so as to preclude the necessity for a repeated explanation thereof.

The embodiment differs from the first embodiment in that the solid-state image sensor 120 is used in place of the solid-state image sensor 3. The following features of the solid-state image sensor 120 differentiate it from the solid-state image sensor 3.

At the solid-state image sensor 120, focus detection areas such as those shown in FIG. 3 are not set at pre-fixed positions in its effective pixel area but instead, pixel blocks that include AF pixels 20F are disposed in a two-dimensional pattern over the entire effective pixel area. As shown in FIG. 23, pixel blocks each made up with two AF pixels 20F (an AF pixel 20U and an AF pixel 20D) and two imaging pixels 20A are disposed in a two-dimensional pattern in the middle area (equivalent to the middle area 101a in FIG. 15) of the effective pixel area. In the middle area, AF pixels 20U and AF pixels 20D are disposed with a zigzag pattern in each pair of adjacent columns. As shown in FIG. 24, pixel blocks each made up with two AF pixels 20F (an AF pixel 20R and an AF pixel 20L) and two imaging pixels 20A are disposed in a two-dimensional pattern in the upper area (equivalent to the upper area 101b in FIG. 15) and the lower area (equivalent to the lower area 101c in FIG. 15) of the effective pixel area. In the upper area and the lower area, AF pixels 20R and AF pixels 20L are disposed with a zigzag pattern in each pair of adjacent rows. It is to be noted that since AF pixels 20F are disposed in a zigzag pattern, better image quality over that achieved in the third embodiment is assured for the same reasons as those described in reference to the second embodiment.

Since the AF pixels 20F are distributed over the entire effective pixel area in the embodiment, the focusing condition can be detected based upon the signals from AF pixels 20F occupying a desirable position in the effective pixel area 101 in correspondence to a specific subject, i.e., occupying the optimal position corresponding to the subject. As a result, an improvement in the focus detection accuracy is achieved.

While the AF pixels 20F are distributed over the entire effective pixel area in the embodiment, the signals generated at the imaging pixels 20A set adjacent to the AF pixels 20F can be used for interpolation during imaging operation, as in the first embodiment. Consequently, the accuracy of the interpolation executed for the AF pixels 20F is improved and ultimately, a high-quality image can be provided.

The pixels 20 disposed with the pixel arrangement described above may assume a circuit structure identical to that explained in reference to the first embodiment. However, the AF pixels 20F do not need to include color filters 50 disposed thereat.

As an alternative, a circuit structure similar to that described in reference to FIG. 3, with two pixels 20 in the same column in each block sharing a single output unit, may be adopted. In such a case, color filters 50 should also be disposed at the AF pixels 20F.

Sixth Embodiment

Figure 25:
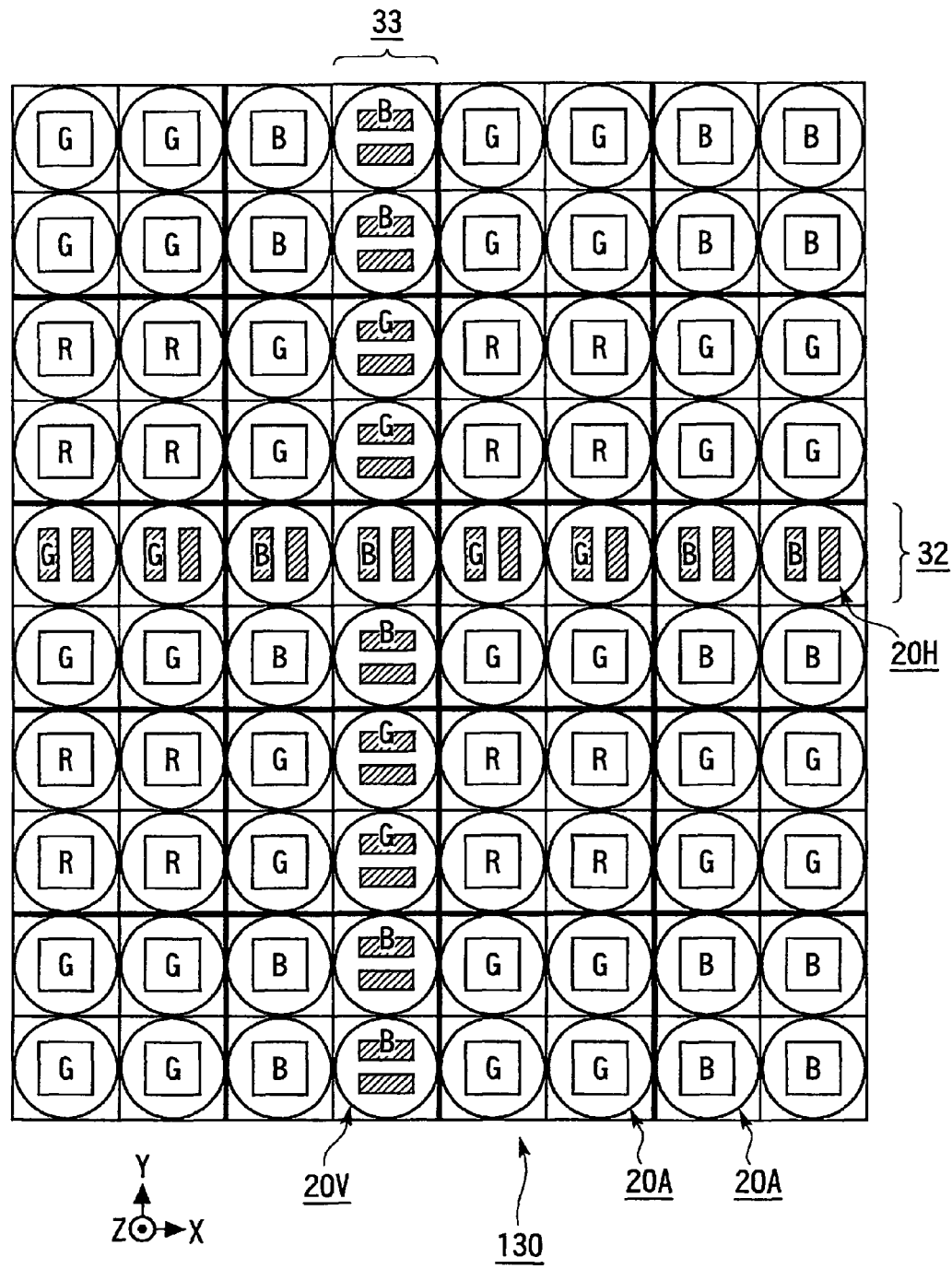
FIG. 25 shows a schematic plan view showing, in a partial enlargement, the pixel arrangement adopted in the solid-state image sensor in the electronic camera achieved in a sixth embodiment of the present invention.

FIG. 25, corresponding to FIG. 4, is a schematic plan view, showing in a partial enlargement the pixel arrangement adopted in a solid-state image sensor 130 in the electronic camera achieved in the sixth embodiment of the present invention. In FIG. 25, the same reference numerals are assigned to elements identical to or corresponding to the elements in FIG. 4 so as to preclude the necessity for a repeated explanation thereof.

The embodiment differs from the first embodiment in that the solid-state image sensor 130 is used in place of the solid-state image sensor 3. The following features of the solid-state image sensor 120 differentiate it from the solid-state image sensor 3.

The solid-state image sensor 130 is achieved by modifying the solid-state image sensor 3, with AF pixels 20H replacing all AF pixels 20R and 20L at the solid-state image sensor 3 and AF pixels 20V replacing all the AF pixels 20U and 20D at the solid-state image sensor 3.

Figure 26A:
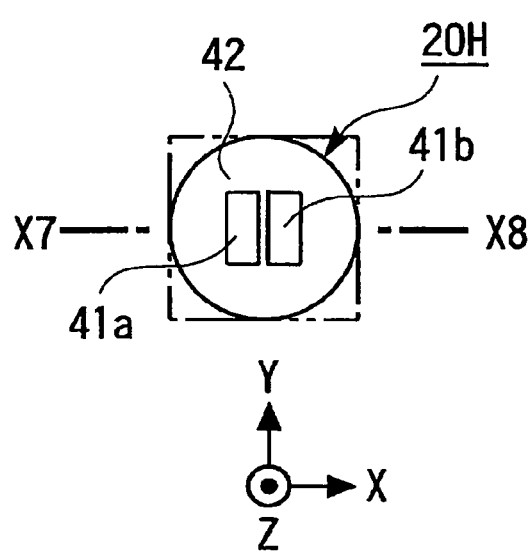
FIGS. 26A and 26B show schematic illustrations of the essential structure of a specific type of AF pixel in FIG. 25, with FIG. 26A showing a schematic plan view showing the essential structure of an pixel and FIG. 26B showing a schematic sectional view taken along line X7-X8 in FIG. 26A.
Figure 26B:
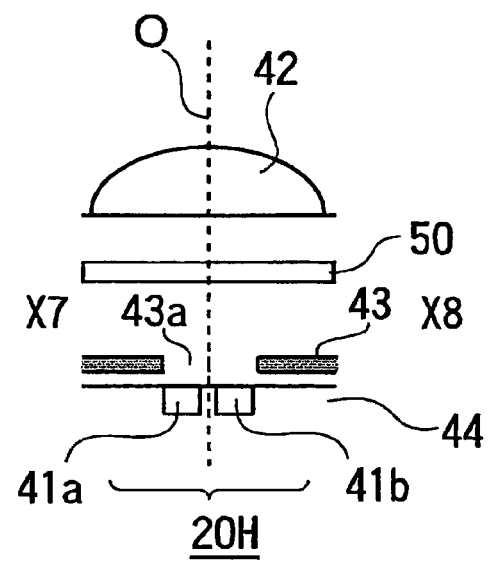
Figure 28:
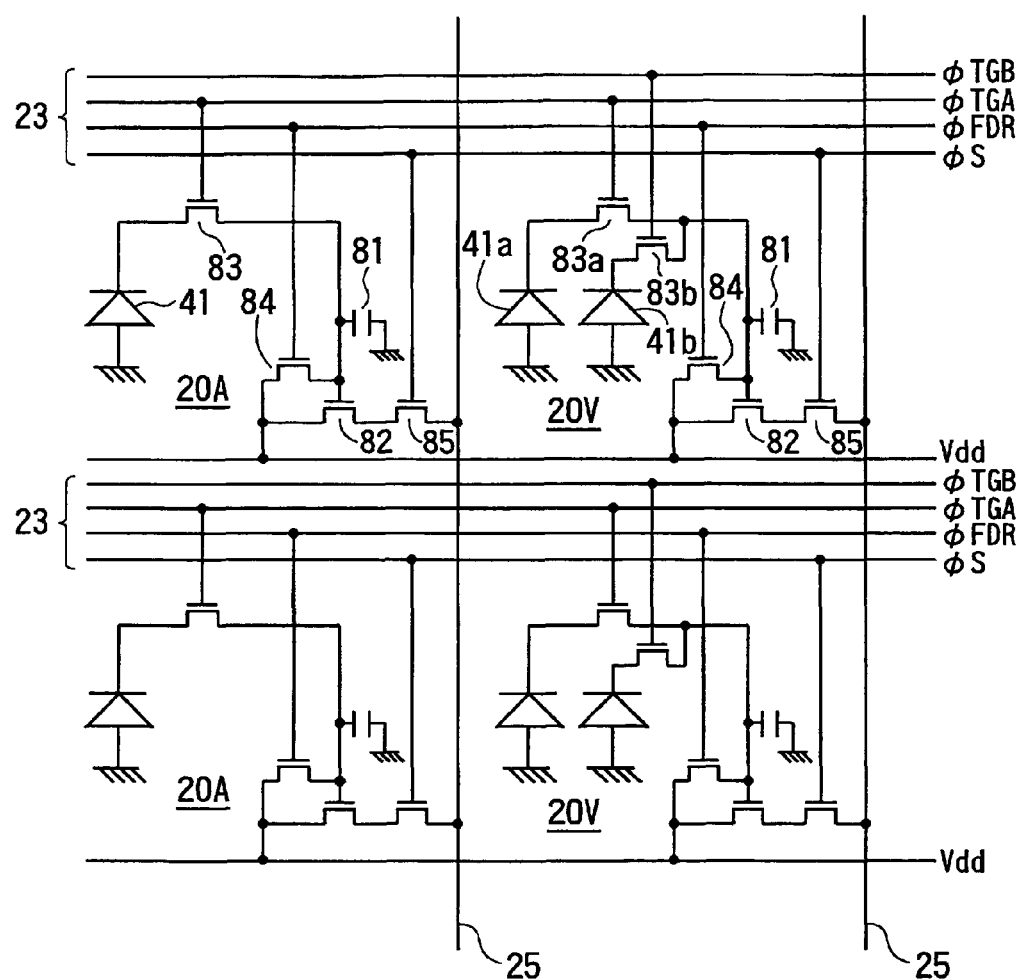
FIG. 28 shows a circuit diagram of a single pixel block made up with 2×2 pixels in the solid-state image sensor shown in FIG. 25.

FIG. 26A is a schematic plan view showing the essential structure of an pixel 20H, whereas FIG. 26B is a schematic sectional view taken along line X7-X8 in FIG. 26A. FIG. 27A is a schematic plan view showing the essential structure of a pixel 20V, whereas FIG. 27B is a schematic sectional view taken along line Y5-Y6 in FIG. 27A. FIG. 28 is a circuit diagram assumed in a pixel block made up with 2×2 pixels at the solid-state image sensor 130. FIG. 28 shows a pixel block containing part of the focus detection area 33 (see FIG. 25), i.e., a pixel block made up with two AF pixels 20V and two imaging pixels 20A. In FIGS. 26A~28, the same reference numerals are assigned to elements identical to those in FIGS. 5A, 5B and 10 to preclude the necessity for a repeated explanation thereof.

Identical circuit structures are adopted in the AF pixels 20H and the AF pixels 20V. The circuit structure of the AF pixels 20H and 20V differs from that of the imaging pixels 20A in that they each include two split photodiodes 41a and 41b instead of a single diode 41 and that they each include two transfer transistors 83a and 83b, in correspondence to the two photodiodes 41a and 41b, capable of operating independently of each other instead of a single transfer transistor 83. The transfer transistor 83a transfers the electrical charge from the photodiode 41a to the FD 81, whereas the transfer transistor 83b transfers the electrical charge from the photodiode 41b to the FD 81.

As can be clearly understood by referring to FIGS. 26A, 26B, 27A, 27B 5A and 5B, the photodiodes 41a and 41b at each AF pixel 20H are formed by splitting a photodiode equivalent to the photodiode 41 into two portions, i.e., a −X side portion and a +X side portion. The photodiodes 41a and 41b at each AF pixels 20V are formed by splitting a photodiode equivalent to the photodiode 41 into two portions, i.e., a +Y side portion and a −Y side portion.

The gate electrodes at the transfer transistors 83 of the imaging pixels 20A and the gate electrodes at the transfer transistors 83a of the AF pixels 20V and 20H in each pixel row are connected commonly and a drive signal ØTGA is provided from the vertical scanning circuit 21 via the corresponding drive wiring 23. The gate electrodes at the other transfer transistors 83b of the AF pixels 20V and 20H in each pixel row are connected commonly and a drive signal ØTGB is provided from the vertical scanning circuit 21 via the corresponding drive wiring 23.

Figure 29:
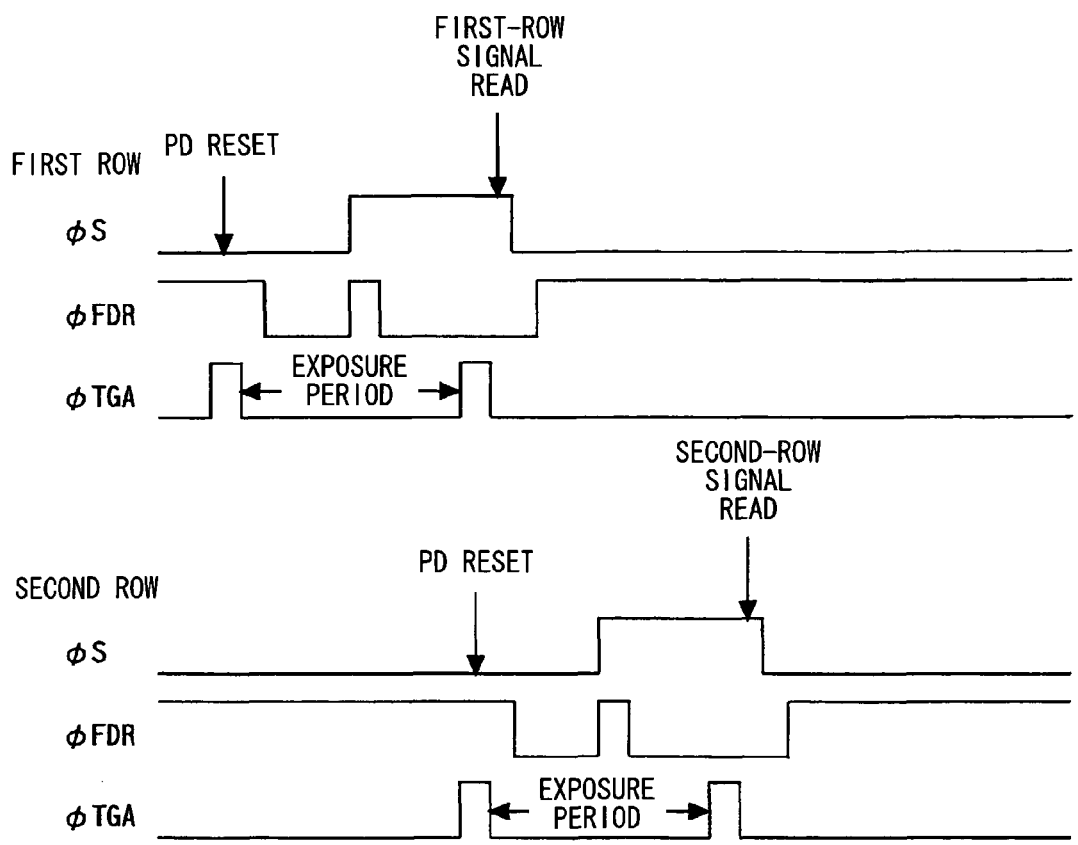
FIG. 29 shows a timing chart for an operation that may be executed in the solid-state image sensor in FIG. 25.

FIG. 29 is a timing chart of an operation that may be executed at the solid-state image sensor 130. It shows how imaging signals may be obtained by driving the image sensor as a rolling shutter. The operation is similar to that in FIG. 11 described in reference to the first embodiment. ØTGA is identical to ØTG in FIG. 11. Since signals from the AF pixels 20H and 20V are not used in this operation, any signal may be used as ØTGB. Accordingly, the timing chart in FIG. 29 does not include ØTGB.

Figure 30:
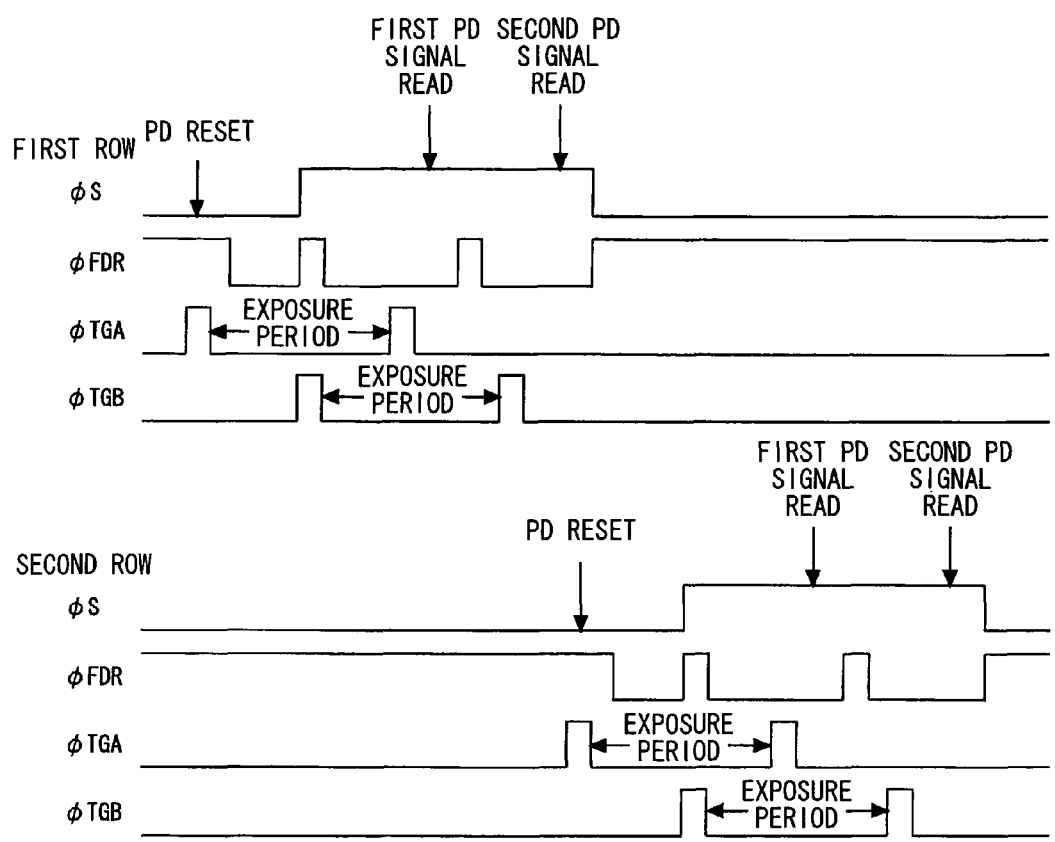
FIG. 30 shows a timing chart for another operation that may be executed in the solid-state image sensor in FIG. 25.

FIG. 30 is a timing chart of another operation that may be executed at the solid-state image sensor 130. It shows how focus detection signals may be obtained by driving the image sensor as a rolling shutter. The operation in FIG. 30 differs from that shown in FIG. 29 in that signals are separately read out from the two photodiodes 41a and 41b. Namely, as ØS shifts to high level and the corresponding row is selected, the electrical charge originating from one of the photodiodes, i.e., the photodiode 41a is first read and then the electrical charge originating from the other photodiode 41b is read out in the operation shown in FIG. 30.

Advantages similar to those of the first embodiment are achieved in this embodiment. In addition, since the AF pixels in the embodiment are AF pixels 20H and 20V each equipped with two photodiodes 41a and 41b, a higher level of distribution density is achieved over an area where focus detection signals are obtained. As a result, even better focus detection accuracy is assured.

While the solid-state image sensor 130 in the embodiment is obtained by modifying the solid-state image sensor 3 in the first embodiment, the solid-state image sensors achieved in the other embodiments and variations thereof may each be modified by replacing all the AF pixels 20R and 20L with AF pixels 20H and all the AF pixels 20U and 20D with AF pixels 20V.

The embodiments and variations thereof described above are simply provided as examples and the present invention is in no way bound or limited to the specifics of these examples.

For instance, the arrangement patterns with which pixel blocks are disposed, having been described in reference to the various embodiments, may be adopted in optimal combinations. For instance, the arrangement pattern shown in FIG. 16 may be adopted for the middle area 101a in FIG. 15 and the arrangement pattern shown in FIG. 24 may be adopted for the upper area 101b and the lower area 101c in FIG. 15.

What is claimed is:

1. An imaging apparatus, comprising: a solid-state image sensor in which a plurality of imaging pixel blocks and a plurality of focusing pixel blocks are disposed in a two-dimensional pattern, and that executes photoelectric conversion for a subject image formed through an optical system, each of the imaging pixel blocks including a plurality of imaging pixels that output imaging signals, the imaging pixels being disposed in a two-dimensional pattern, each of the focusing pixel blocks including at least one of the imaging pixels and a plurality of focus detection pixels that output focus detection signals, the at least one of the imaging pixels and the focus detection pixels being disposed in a two-dimensional pattern; an image processing unit that obtains an image signal regarding each of the imaging pixel blocks and an image signal regarding each of the focusing pixel blocks and generates an image data based on the image signals regarding the imaging pixel blocks and the image signals regarding the focusing pixel blocks; a focus detection unit that detects a focusing condition based upon the focus detection signals output from the focus detection pixels and outputs a detection signal; and an adjustment unit that executes focus adjustment for the optical system based upon the detection signal provided from the focus detection unit, wherein: the imaging pixels output the imaging signals obtained through photoelectric conversion executed on a light flux received from an area of an exit pupil of the optical system, which is substantially not offset from a center of the exit pupil; the focus detection pixels output the focus detection signal obtained through photoelectric conversion executed on a light flux selectively received from an area of the exit pupil of the optical system, which is substantially offset from the center of the exit pupil; imaging pixel blocks and the focusing pixel blocks each include m×n pixels disposed in a two-dimensional pattern with m pixels and n pixels among the plurality of pixels set respectively along a columnar direction and along a row direction, where m and n each represent an integer equal or greater than 2; color filters having a single color being disposed at the imaging pixels belonging to a each of the respective imaging pixel blocks; and the image processing unit obtains the image signal regarding each of the imaging pixel blocks based upon the imaging signals output from the imaging pixels disposed in the respective imaging pixel blocks, and obtains the image signal regarding each of the focusing pixel blocks by executing an interpolation process based upon the imaging signals output from at least one of the imaging pixels in the respective focusing pixel blocks and the focus detection signals output from at least one of the focus detection pixels in the respective focusing pixel blocks.

2. An imaging apparatus according to claim 1, wherein:
the plurality of focusing pixel blocks include a first focusing pixel block, a second focusing pixel block and a third focusing pixel block;
the first focusing pixel blocks are disposed corresponding to first focus detection areas formed along the columnar direction;
the second focusing pixel blocks are disposed corresponding to second focus detection areas formed along the row direction;
the third focusing pixel blocks are disposed corresponding to an area at which the first focusing area and the second focusing area intersect with each other;
the focusing pixels are disposed along the columnar direction in the first focusing pixel block;
the focusing pixels are disposed along the row direction in the second focusing pixel block; and
n focusing pixels are disposed along the row direction, (m−1) focusing pixels are disposed along the columnar direction, and at least one first pixel is disposed in the third focusing pixel block.

3. An imaging apparatus according to claim 1, wherein:
m and n each represent 2.

4. An imaging apparatus according to claim 2, wherein:
the focusing pixels in the first focusing pixel blocks are disposed adjacent to each other along the columnar direction, and the focusing pixels in the second focusing pixel blocks are disposed adjacent to each other along the row direction.

5. An imaging apparatus according to claim 2, wherein:
the focusing pixels in the first focusing pixel blocks are disposed so as not to be adjacent to each other along the columnar direction, and the focusing pixels in the second focusing pixel blocks are disposed so as not to be adjacent to each other along the row direction.

6. An imaging apparatus according to claim 1, wherein:
the plurality of pixel blocks are set in a Bayer array based upon colors assumed for the pixel blocks by regarding the color of the color filters disposed at the first pixel in each pixel block as representing the color of the pixel block.

7. An imaging apparatus according to claim 1, wherein:
each of the focusing pixel blocks include two focusing pixels, one of which includes a single photoelectric conversion unit and outputs a first focus detection signal obtained through photoelectric conversion executed on a light flux selectively received from an area of the exit pupil of the optical system, substantially offset along a specific direction from the center of the exit pupil and another one of which includes a single photoelectric conversion unit and outputs a second focus detection signal obtained through photoelectric conversion executed on a light flux selectively received from an area of the exit pupil of the optical system, substantially offset from the center of the exit pupil of the optical system along a direction opposite from the specific direction.

8. An imaging apparatus according to claim 1, wherein:
the focusing pixels each include a first photoelectric conversion unit and a second photoelectric conversion unit, the first photoelectric conversion unit selectively receiving a light flux from an area of the exit pupil of the optical system, substantially offset from the center of the exit pupil along a specific direction, the second photoelectric conversion unit selectively receiving a light flux from an area of the exit pupil of the optical system, substantially offset from the center of the exit pupil along a direction opposite from the specific direction, which individually outputs signals obtained through photoelectric conversion individually executed at the first photoelectric conversion unit and the second photoelectric conversion unit.

9. An imaging apparatus according to claim 1, wherein:
n pixels present in a single column in each pixel block shares a common amplifier unit that outputs a signal corresponding to a potential assumed at a charge/voltage conversion unit that receives the electrical charge generated at the photoelectric conversion unit and converts the electrical charge to a voltage.

10. An imaging apparatus according to claim 1, wherein:
the plurality of imaging pixel blocks and the plurality of focusing pixel blocks are disposed in an imaging area, the imaging area including a first area in a middle area of the imaging area, a second area in an upper area of the imaging area and a third area in a lower area of the imaging area.

11. An imaging apparatus according to claim 1, wherein:
a color filter having a color matching the color of the color filter disposed at the imaging pixel in the focusing pixel block, to which the focusing pixel belongs, is disposed at the focusing pixel.

12. An imaging apparatus according to claim 1, wherein:
no color filter is disposed at the focusing pixel.

13. An imaging apparatus, comprising: a solid-state image sensor in which a plurality of pixel blocks are disposed in a two-dimensional pattern, and that executes photoelectric conversion for a subject image formed through an optical system, each of the pixel blocks including a plurality of imaging pixels that output imaging signals and a plurality of focus detection pixels that output focus detection signals, the imaging pixels and the focus detection pixels being disposed in a two-dimensional pattern; an image processing unit that generates an image data based upon the image signal output from the imaging pixels in the pixel block; a focus detection unit that detects a focusing condition based upon the focus detection signals output from the focus detection pixels and outputs a detection signal; and an adjustment unit that executes focus adjustment for the optical system based upon the detection signal provided from the focus detection unit, wherein; the imaging pixels output the imaging signals obtained through photoelectric conversion executed on a light flux received from an area of an exit pupil of the optical system, which is substantially not offset from a center of the exit pupil; the focus detection pixels output the focus detection signals obtained through photoelectric conversion executed on a light flux selectively received from an area of the exit pupil of the optical system, which is substantially offset from the center of the exit pupil; the pixel blocks each include m×n pixels disposed in a two-dimensional pattern with m pixels and n pixels among the plurality of pixels set respectively along a columnar direction and along a row direction, where m and n each represent an integer equal to or greater than 2; color filters having a single color being disposed at the imaging pixels belonging to each of the respective pixel blocks; and the image processing unit generates the image data by executing an interpolation process based upon the imaging signals output from at least one of the imaging pixels in the respective focusing pixel blocks and the focus detection signals output from at least one of the focus detection pixels in the respective focusing pixel blocks.

14. The imaging apparatus according to claim 13, wherein:
the plurality of pixel blocks include a first pixel block distributed over a middle area of an imaging area and a second pixel block distributed over an upper area and a lower area of the imaging area;
the focusing pixels are disposed along the columnar direction in the first pixel block; and
the focusing pixels are disposed along the row direction in the second pixel block.

15. The imaging apparatus according to claim 13, wherein:
the focusing pixels in the first pixel blocks are disposed adjacent to each other along the columnar direction, and the focusing pixels in the second pixel blocks are disposed adjacent to each other along the row direction.

16. An imaging apparatus comprising: a solid state image sensor that executes photoelectric conversion for a subject image formed through an optical system, the solid state image, sensor comprising: a plurality of pixels disposed in a two-dimensional pattern and each equipped with a photoelectric conversion unit that generates and stores an electrical charge corresponding to an incident light; a plurality of pixel blocks disposed in a two-dimensional pattern and each including at least two pixels; and a color filter disposed at each of the plurality of pixels; wherein the plurality of pixels are each one of an imaging pixel outputting an imaging signal and a focusing pixel outputting a focusing signal; the plurality of pixel blocks are each one of a first pixel block that includes at least two imaging pixels and a second pixel block that includes at least one imaging pixel and at least one focusing pixel; and the color filters disposed at the pixels included in each of the respective pixel blocks have a single color; and an image processing unit that generates an image data based upon the image signal output from the imaging pixels in the first pixel block and generates the image data by executing an interpolation process based upon the imaging signals output from at least one of the imaging pixels in the respective focusing pixel blocks and the focusing signals output from at least one of the focusing pixels in the respective focusing pixel blocks.

17. An imaging apparatus according to claim 16, wherein each of the plurality of pixel blocks include four pixels; the first pixel block includes four imaging pixels; and the second pixel block includes two imaging pixels and two focusing pixels.

18. An imaging apparatus, comprising: a solid-state image sensor in which a plurality of imaging pixel blocks and a plurality of focusing pixel blocks are disposed in a two-dimensional pattern, and that executes photoelectric conversion for a subject image formed through an optical system, each of the imaging pixel blocks including a plurality of imaging pixels that output imaging signals, the imaging pixels being disposed in a two-dimensional pattern, each of the focusing pixel blocks including at least one of the imaging pixels and a plurality of focus detection pixels that output focus detection signals, the at least one of the imaging pixels and the focus detection pixels being disposed in a two-dimensional pattern; an image processing unit that obtains an image signal regarding each of the imaging pixel blocks and an image signal regarding each of the focusing pixel blocks and generates an image data based on the image signals regarding the imaging pixel blocks and the image signals regarding the focusing pixel blocks; a focus detection unit that detects a focusing condition based upon the focus detection signals output from the focus detection pixels and outputs a detection signal; and an adjustment unit that executes focus adjustment for the optical system based upon the detection signal provided from the focus detection unit, wherein: the imaging pixels output the imaging signals obtained through photoelectric conversion executed on a light flux received from an area of an exit pupil of the optical system, which is substantially not offset from a center of the exit pupil; the focus detection pixels output the focus detection signal obtained through photoelectric conversion executed on a light flux selectively received from an area of the exit pupil of the optical system, which is substantially offset from the center of the exit pupil; imaging pixel blocks and the focusing pixel blocks each include m×n pixels disposed in a two-dimensional pattern with m pixels and n pixels among the plurality of pixels set respectively along a columnar direction and along a row direction, where m and n each represent an integer equal or greater than 2; color filters having a single color being disposed at the imaging pixels belonging to a each of the respective imaging pixel blocks; and the image processing unit obtains the image signal regarding each of the imaging pixel blocks based upon the imaging signals output from the imaging pixels disposed in the respective imaging pixel blocks, and obtains the image signal regarding each of the focusing pixel blocks by executing an interpolation process based upon a weighted average of the imaging signals output from at least one of the imaging pixels in the respective focusing pixel blocks and the focus detection signals output from at least one of the focus detection pixels in the respective focusing pixel blocks.

* * * * *